(12) United States Patent
Kim et al.

(10) Patent No.: US 11,211,953 B2
(45) Date of Patent: Dec. 28, 2021

(54) RATE MATCHING PERFORMING METHOD FOR LDPC CODE AND COMMUNICATION DEVICE THEREFOR

(71) Applicant: LG Electronics Inc., Seoul (KR)

(72) Inventors: Bonghoe Kim, Seoul (KR); Jongwoong Shin, Seoul (KR); Ilmu Byun, Seoul (KR)

(73) Assignee: LG Electronics Inc., Seoul (KR)

( * ) Notice: Subject to any disclaimer, the term of this patent is extended or adjusted under 35 U.S.C. 154(b) by 45 days.

(21) Appl. No.: 16/634,975

(22) PCT Filed: Jul. 27, 2018

(86) PCT No.: PCT/KR2018/008540
§ 371 (c)(1),
(2) Date: Jan. 29, 2020

(87) PCT Pub. No.: WO2019/027185
PCT Pub. Date: Feb. 7, 2019

(65) Prior Publication Data
US 2020/0244285 A1 Jul. 30, 2020

Related U.S. Application Data

(60) Provisional application No. 62/585,562, filed on Nov. 14, 2017, provisional application No. 62/577,192, (Continued)

(51) Int. Cl.
*H03M 13/00* (2006.01)
*H03M 13/09* (2006.01)
(Continued)

(52) U.S. Cl.
CPC ..... *H03M 13/6393* (2013.01); *H03M 13/098* (2013.01); *H03M 13/1102* (2013.01);
(Continued)

(58) Field of Classification Search
CPC .................................................. H03M 13/6393
See application file for complete search history.

(56) References Cited

U.S. PATENT DOCUMENTS 8,441,999 B2 * 5/2013 Xiao ................... H04W 72/042
370/329
2005/0053168 A1 * 3/2005 Song ..................... H04L 1/0071
375/261
(Continued)

OTHER PUBLICATIONS

Intel Corporation, "Soft buffer requirement for feMTC UEs with larger max TBS", 3GPP TSG RAN WG1 Meeting #87, Nov. 14-18, 2016, R1-1611936.
(Continued)

*Primary Examiner* — Joseph D Torres
(74) *Attorney, Agent, or Firm* — Dentons US LLP

(57) ABSTRACT

A method by which a terminal performs rate matching for a low density parity check (LDPC) code can comprise the steps of: determining any one transport block size (TBS) among a plurality of TBSs set for rate matching in the terminal; and performing rate matching for the LDPC code on the basis of the selected TBS. The UE is capable of communicating with at least one of another UE, a UE related to an autonomous driving vehicle, a base station or a network.

17 Claims, 14 Drawing Sheets

Related U.S. Application Data filed on Oct. 26, 2017, provisional application No. 62/539,580, filed on Aug. 1, 2017.

(51) Int. Cl.
*H03M 13/11* (2006.01)
*H04L 5/00* (2006.01)

(52) U.S. Cl.
CPC ..... *H03M 13/635* (2013.01); *H03M 13/6522* (2013.01); *H04L 5/0094* (2013.01)

(56) References Cited

U.S. PATENT DOCUMENTS

| | | | |
|---|---|---|---|
| 2010/0050034 A1* | 2/2010 | Che | H04L 1/1845 714/748 |
| 2012/0114021 A1* | 5/2012 | Chung | H04B 7/15557 375/211 |
| 2012/0320846 A1* | 12/2012 | Papasakellariou | H04W 72/042 370/329 |
| 2013/0139025 A1* | 5/2013 | Gioulekas | H03M 13/6583 714/752 |
| 2013/0223366 A1* | 8/2013 | Papasakellariou | H04L 5/0094 370/329 |
| 2014/0187283 A1* | 7/2014 | Nimbalker | H04W 76/14 455/550.1 |
| 2014/0198758 A1 | 7/2014 | Nimbalker et al. | |
| 2017/0064689 A1 | 3/2017 | Nimbalker et al. | |

OTHER PUBLICATIONS

Sony, "DCI for 10 HARQ Process operation in feMTC", 3GPP TSG RAN WG1 Meeting #88, Feb. 13-17, 2017, R1-1703119.

Intel Corporation, "LDPC Coding chain", 3GPP TSG RAN WG1 Meeting NR-Adhoc#2, Jun. 27-30, 2017, R1-1711344.

* cited by examiner

RATE MATCHING PERFORMING METHOD FOR LDPC CODE AND COMMUNICATION DEVICE THEREFOR

This application is a National Stage Entry of International Application No. PCT/KR2018/008540 filed Jul. 27, 2018, which claims the benefit of U.S. Provisional Application Nos. 62/539,580 filed Aug. 1, 2017; 62/577,192 filed Oct. 26, 2017 and 62/585,562 filed Nov. 14, 2017, all of which are hereby incorporated by reference in their entirety for all purposes as if fully set forth herein.

TECHNICAL FIELD

The present disclosure relates to wireless communication and, more particularly, to a method of performing rate matching for a low-density parity check (LDPC) code and a communication apparatus therefor.

BACKGROUND ART

In the next generation 5G system, scenarios can be divided into Enhanced Mobile Broadband (eMBB), Ultra-reliable Machine-Type Communications (uMTC), Massive Machine-Type Communications (mMTC), etc. The eMBB corresponds to a next generation mobile communication scenario characterized by high spectrum efficiency, high user experienced data rates, high peak data rates, etc. The uMTC corresponds to a next generation mobile communication scenario characterized by ultra-high reliability, ultra-low latency, ultra-high availability, etc. (for example, the uMTC may include V2X, emergency services, remote control, etc.). The mMTC corresponds to a next generation mobile communication scenario characterized by low cost, low energy, short packets, massive connectivity, etc. (for example, the mMTC may include Internet of Things (IoT)).

DISCLOSURE

Technical Problem

An object of the present disclosure is to provide a method of performing rate matching for an LDPC code.

Another object of the present disclosure is to provide a UE for performing rate matching for an LDPC code.

It will be appreciated by persons skilled in the art that the objects that could be achieved with the present disclosure are not limited to what has been particularly described hereinabove and the above and other objects that the present disclosure could achieve will be more clearly understood from the following detailed description.

Technical Solution

According to an aspect of the present disclosure, provided herein is a method of performing rate matching for a low-density parity check (LDPC) code by a user equipment (UE), including determining any one transport block size (TBS) among a plurality of TBSs configured for rate matching for the UE; and performing rate matching for the LDPC code based on the determined TBS. The rate matching may be related with limited buffer rate matching (LBRM) and the method may further include receiving information about the LBRM configured for the UE from a base station (BS). Based on LBRM configured for the UE as the rate matching, the TBS may be determined under the assumption that only a specific code rate among a plurality of code rates is used. The TBS may be determined based on the number of resource elements (REs) allocated to one physical resource block (PRB). The number of REs allocated to the one PRB may be determined in consideration of reference signal (RS) overhead. The number of REs allocated to the one PRB may be differently configured according to a provided service type. The TBS may differ according to the size of coded bits defined by the LBRM. The method may further include receiving information about the number of REs allocated to the one PRB from the BS.

In another aspect of the present disclosure, provided herein is a user equipment (UE) for performing rate matching for a low-density parity check (LDPC) code, including a processor configured to determine any one transport block size (TBS) among a plurality of TBSs configured for rate matching for the UE, and perform rate matching for the LDPC code based on the determined TBS. The rate matching may be related with limited buffer rate matching (LBRM) and the UE may further include a receiver configured to receive information about the LBRM configured for the UE from a base station (BS). Based on LBRM configured for the UE as the rate matching, the processor may be configured to determine the TBS under the assumption that only a specific code rate among a plurality of code rates is used. The TBS may be determined by the processor based on the number of resource elements (REs) allocated to one physical resource block (PRB). The processor may be configured to determine the number of REs allocated to the one PRB in consideration of reference signal (RS) overhead in the one PRB. The number of REs allocated to the one PRB may be differently configured according to a provided service type. The TBS may differ according to the size of coded bits defined by the LBRM. The UE may further include a receiver configured to receive information about the number of REs allocated to the one PRB from the BS.

Advantageous Effects

A method of performing rate matching for an LDPC according to an embodiment of the present disclosure may improve rate matching performance by determining a proper TBS when limited buffer rate matching (LBRM) is configured.

The effects that can be achieved through the embodiments of the present disclosure are not limited to what has been particularly described hereinabove and other effects which are not described herein can be derived by those skilled in the art from the following detailed description.

DESCRIPTION OF DRAWINGS

The accompanying drawings, which are included to provide a further understanding of the disclosure and are incorporated in and constitute a part of this specification, illustrate embodiments of the disclosure.

BEST MODE FOR CARRYING OUT THE DISCLOSURE

Figure 1:
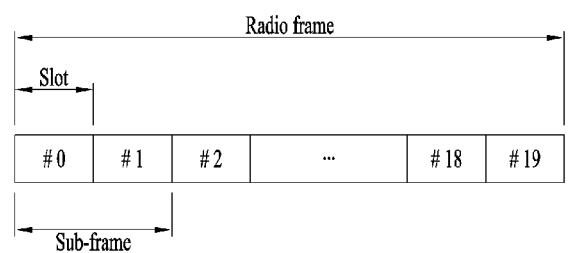
FIG. 1 is a block diagram for configurations of a base station 105 and a user equipment 110 in a wireless communication system 100.

Reference will now be made in detail to the preferred embodiments of the present disclosure, examples of which are illustrated in the accompanying drawings. In the following detailed description of the disclosure includes details to help the full understanding of the present disclosure. Yet, it is apparent to those skilled in the art that the present disclosure can be implemented without these details. For instance, although the following descriptions are made in detail on the assumption that a mobile communication system includes 3GPP LTE system, the following descriptions are applicable to other random mobile communication systems in a manner of excluding unique features of the 3GPP LTE.

Occasionally, to prevent the present disclosure from getting vaguer, structures and/or devices known to the public are skipped or can be represented as block diagrams centering on the core functions of the structures and/or devices. Wherever possible, the same reference numbers will be used throughout the drawings to refer to the same or like parts.

Besides, in the following description, assume that a terminal is a common name of such a mobile or fixed user stage device as a user equipment (UE), a mobile station (MS), an advanced mobile station (AMS) and the like. And, assume that a base station (BS) is a common name of such a random node of a network stage communicating with a terminal as a Node B (NB), an eNode B (eNB), an access point (AP) and the like. Although the present specification is described based on IEEE 802.16m system, contents of the present disclosure may be applicable to various kinds of other communication systems.

In a mobile communication system, a user equipment is able to receive information in downlink and is able to transmit information in uplink as well. Information transmitted or received by the user equipment node may include various kinds of data and control information. In accordance with types and usages of the information transmitted or received by the user equipment, various physical channels may exist.

The embodiments of the present disclosure can be applied to various wireless access systems such as Code Division Multiple Access (CDMA), Frequency Division Multiple Access (FDMA), Time Division Multiple Access (TDMA), Orthogonal Frequency Division Multiple Access (OFDMA), Single Carrier Frequency Division Multiple Access (SC-FDMA), etc. CDMA may be implemented as a radio technology such as Universal Terrestrial Radio Access (UTRA) or CDMA2000. TDMA may be implemented as a radio technology such as Global System for Mobile communications (GSM)/General packet Radio Service (GPRS)/Enhanced Data Rates for GSM Evolution (EDGE). OFDMA may be implemented as a radio technology such as IEEE 802.11 (Wi-Fi), IEEE 802.16 (WiMAX), IEEE 802.20, Evolved UTRA (E-UTRA), etc. UTRA is a part of Universal Mobile Telecommunications System (UMTS). 3GPP LTE is a part of Evolved UMTS (E-UMTS) using E-UTRA, adopting OFDMA for DL and SC-FDMA for UL. LTE-Advanced (LTE-A) is an evolution of 3GPP LTE.

Moreover, in the following description, specific terminologies are provided to help the understanding of the present disclosure. And, the use of the specific terminology can be modified into another form within the scope of the technical idea of the present disclosure.

FIG. 1 is a block diagram for configurations of a base station 105 and a user equipment 110 in a wireless communication system 100.

Although one base station 105 and one user equipment 110 (D2D user equipment included) are shown in the drawing to schematically represent a wireless communication system 100, the wireless communication system 100 may include at least one base station and/or at least one user equipment.

Referring to FIG. 1, a base station 105 may include a transmitted (Tx) data processor 115, a symbol modulator 120, a transmitter 125, a transceiving antenna 130, a processor 180, a memory 185, a receiver 190, a symbol demodulator 195 and a received data processor 197. And, a user equipment 110 may include a transmitted (Tx) data processor 165, a symbol modulator 170, a transmitter 175, a transceiving antenna 135, a processor 155, a memory 160, a receiver 140, a symbol demodulator 155 and a received data processor 150. Although the base station/user equipment 105/110 includes one antenna 130/135 in the drawing, each of the base station 105 and the user equipment 110 includes a plurality of antennas. Therefore, each of the base station 105 and the user equipment 110 of the present disclosure supports an MIMO (multiple input multiple output) system. And, the base station 105 according to the present disclosure may support both SU-MIMO (single user-MIMO) and MU-MIMO (multi user-MIMO) systems.

In downlink, the transmitted data processor 115 receives traffic data, codes the received traffic data by formatting the received traffic data, interleaves the coded traffic data, modulates (or symbol maps) the interleaved data, and then provides modulated symbols (data symbols). The symbol modulator 120 provides a stream of symbols by receiving and processing the data symbols and pilot symbols.

The symbol modulator 120 multiplexes the data and pilot symbols together and then transmits the multiplexed symbols to the transmitter 125. In doing so, each of the transmitted symbols may include the data symbol, the pilot symbol or a signal value of zero. In each symbol duration, pilot symbols may be contiguously transmitted. In doing so, the pilot symbols may include symbols of frequency division multiplexing (FDM), orthogonal frequency division multiplexing (OFDM), or code division multiplexing (CDM).

The transmitter 125 receives the stream of the symbols, converts the received stream to at least one or more analog signals, additionally adjusts the analog signals (e.g., amplification, filtering, frequency upconverting), and then generates a downlink signal suitable for a transmission on a radio channel. Subsequently, the downlink signal is transmitted to the user equipment via the antenna 130.

In the configuration of the user equipment 110, the receiving antenna 135 receives the downlink signal from the base station and then provides the received signal to the receiver 140. The receiver 140 adjusts the received signal (e.g., filtering, amplification and frequency downconverting), digitizes the adjusted signal, and then obtains samples. The symbol demodulator 145 demodulates the received pilot symbols and then provides them to the processor 155 for channel estimation.

The symbol demodulator 145 receives a frequency response estimated value for downlink from the processor 155, performs data demodulation on the received data symbols, obtains data symbol estimated values (i.e., estimated values of the transmitted data symbols), and then provides the data symbols estimated values to the received (Rx) data processor 150. The received data processor 150 reconstructs the transmitted traffic data by performing demodulation (i.e., symbol demapping, deinterleaving and decoding) on the data symbol estimated values.

The processing by the symbol demodulator 145 and the processing by the received data processor 150 are complementary to the processing by the symbol modulator 120 and the processing by the transmitted data processor 115 in the base station 105, respectively.

In the user equipment 110 in uplink, the transmitted data processor 165 processes the traffic data and then provides data symbols. The symbol modulator 170 receives the data symbols, multiplexes the received data symbols, performs modulation on the multiplexed symbols, and then provides a stream of the symbols to the transmitter 175. The transmitter 175 receives the stream of the symbols, processes the received stream, and generates an uplink signal. This uplink signal is then transmitted to the base station 105 via the antenna 135.

In the base station 105, the uplink signal is received from the user equipment 110 via the antenna 130. The receiver 190 processes the received uplink signal and then obtains samples. Subsequently, the symbol demodulator 195 processes the samples and then provides pilot symbols received in uplink and a data symbol estimated value. The received data processor 197 processes the data symbol estimated value and then reconstructs the traffic data transmitted from the user equipment 110.

The processor 155/180 of the user equipment/base station 110/105 directs operations (e.g., control, adjustment, management, etc.) of the user equipment/base station 110/105. The processor 155/180 may be connected to the memory unit 160/185 configured to store program codes and data. The memory 160/185 is connected to the processor 155/180 to store operating systems, applications and general files.

The processor 155/180 may be called one of a controller, a microcontroller, a microprocessor, a microcomputer and the like. And, the processor 155/180 may be implemented using hardware, firmware, software and/or any combinations thereof. In the implementation by hardware, the processor 155/180 may be provided with such a device configured to implement the present disclosure as ASICs (application specific integrated circuits), DSPs (digital signal processors), DSPDs (digital signal processing devices), PLDs (programmable logic devices), FPGAs (field programmable gate arrays), and the like.

Meanwhile, in case of implementing the embodiments of the present disclosure using firmware or software, the firmware or software may be configured to include modules, procedures, and/or functions for performing the above-explained functions or operations of the present disclosure. And, the firmware or software configured to implement the present disclosure is loaded in the processor 155/180 or saved in the memory 160/185 to be driven by the processor 155/180.

Layers of a radio protocol between a user equipment/base station and a wireless communication system (network) may be classified into 1st layer L1, 2nd layer L2 and 3rd layer L3 based on 3 lower layers of OSI (open system interconnection) model well known to communication systems. A physical layer belongs to the 1st layer and provides an information transfer service via a physical channel RRC (radio resource control) layer belongs to the 3rd layer and provides control radio resourced between UE and network. A user equipment and a base station may be able to exchange RRC messages with each other through a wireless communication network and RRC layers.

In the present specification, although the processor 155/180 of the user equipment/base station performs an operation of processing signals and data except a function for the user equipment/base station 110/105 to receive or transmit a signal, for clarity, the processors 155 and 180 will not be mentioned in the following description specifically. In the following description, the processor 155/180 can be regarded as performing a series of operations such as a data processing and the like except a function of receiving or transmitting a signal without being specially mentioned.

Figure 2:
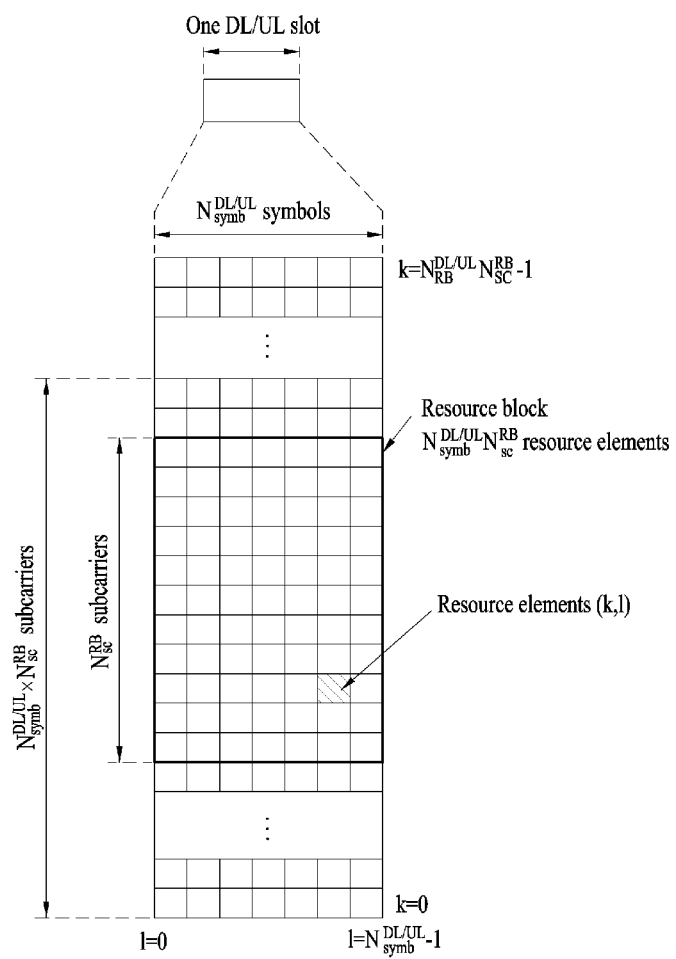
FIG. 2 is a diagram showing the frame structure used in a Long Term Evolution (LTE)/LTE-A system.

FIG. 2 illustrates frame structures used in 3GPP LTE/LTE-A system.

Referring to FIG. 2, one frame corresponds to 10 ms and consists of 10 1-ms subframes. A time required for transmitting one subframe is defined as a transmission time interval (TTI). For example, one subframe consists of two 0.5 ms slots, and each slot consists of seven (or six) orthogonal frequency division multiplexing (OFDM) symbols. The 3GPP LTE system uses OFDMA on downlink, and the OFDM symbol represents one symbol period. An OFDM symbol may be referred to as an SC-FDMA symbol or a symbol period. A resource block (RB), which is a resource allocation unit, includes a plurality of adjacent subcarriers in one slot. The structure of a radio frame shown in FIG. 2 is exemplary and the number of subframes included in a radio frame, the number of slots included in a subframe, or the number of OFDM symbols included in one slot may be changed in various ways.

One resource block (RB) is defined by 12 subcarriers at intervals of 15 kHz and 7 OFDM symbols. A BS transmits a Primary Synchronization Signal (PSS) and a Secondary Synchronization Signal (SSS) for synchronization, and a Physical Broadcast Channel (PBCH) for system information in 6 RBs at a center frequency. Here, the radio frame structure, the signal, and the position of the channel may depend on normal/extended Cyclic Prefix (CP) and Time Division Duplex (TDD)/Frequency Division Duplex (FDD).

Figure 3:
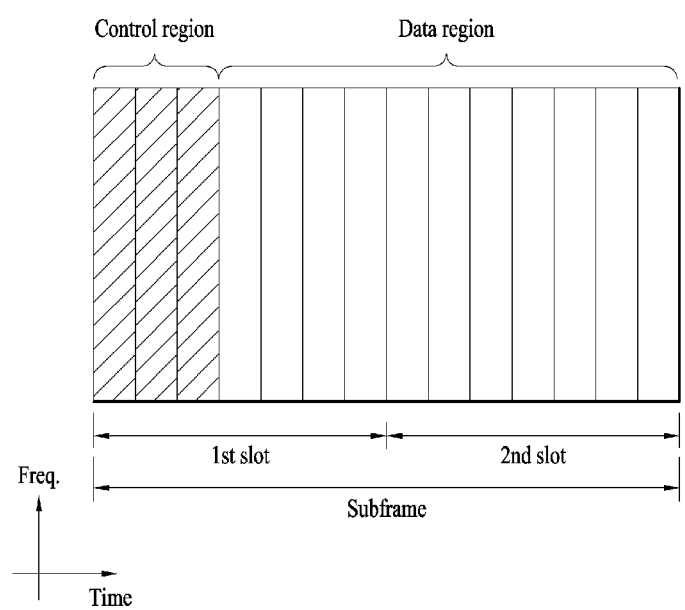
FIG. 3 is a diagram illustrating an exemplary resource grid for the duration of a downlink slot used in 3GPP LTE/LTE-A system, which is an example of a wireless communication system.

FIG. 3 is a diagram illustrating an exemplary resource grid for the duration of a downlink slot used in 3GPP LTE/LTE-A system, which is an example of a wireless communication system.

Referring to FIG. 3, a DL slot includes a plurality of OFDM symbols in the time domain. One DL slot includes 7 (or 6) OFDM symbols and a resource block may include 12 subcarriers in a frequency domain. Each element on a resource grid is called a resource element (RE). One RB includes 12×7 or 12×6 REs. The number NRB of RBs included in the DL slot depends on a DL transmission band. A structure of a UL slot is identical to that of the DL slot but OFDM symbol is replaced by SC-FDMA symbol.

Figure 4:
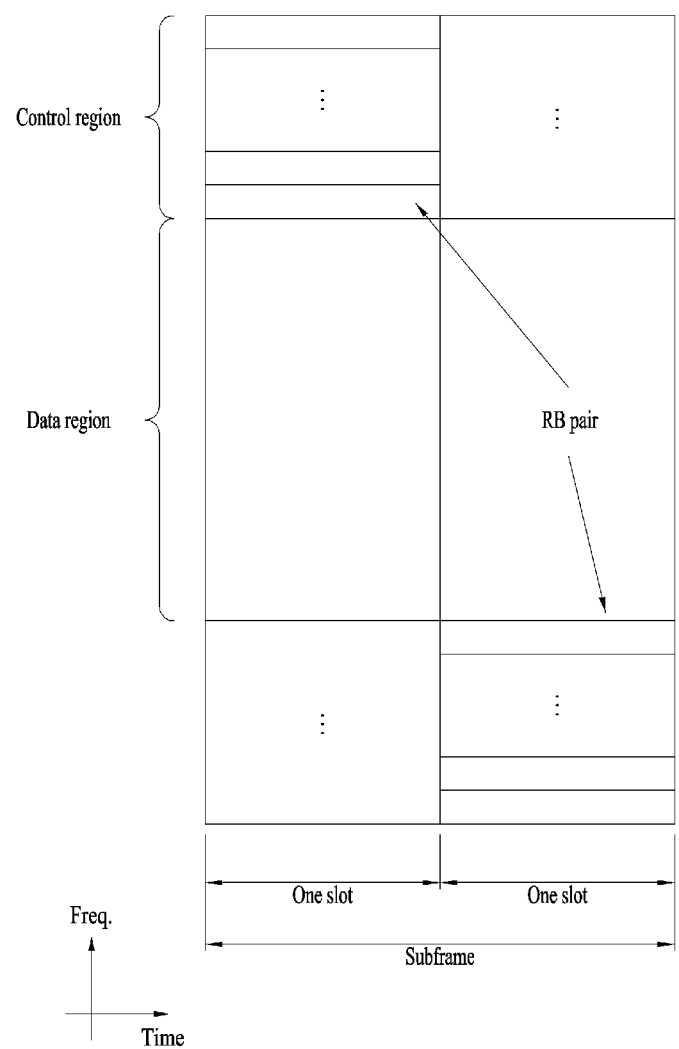
FIG. 4 is a diagram illustrating an exemplary structure of a downlink subframe used in 3GPP LTE/LTE-A system, which is an example of a wireless communication system.

FIG. 4 is a diagram illustrating an exemplary structure of an downlink subframe used in 3GPP LTE/LTE-A system, which is an example of a wireless communication system.

Referring to FIG. 4, up to three (four) OFDM symbols at the start of the first slot in a downlink subframe are used for a control region to which control channels are allocated and the other OFDM symbols of the downlink subframe are used for a data region to which a PDSCH is allocated. Downlink control channels used in the LTE system include a Physical Control Format Indicator CHannel (PCFICH), a Physical Downlink Control CHannel (PDCCH), and a Physical Hybrid automatic repeat request (HARQ) Indicator CHannel (PHICH). The PCFICH is located in the first OFDM symbol of a subframe, carrying information about the number of OFDM symbols used for transmission of control channels in the subframe. The PHICH delivers an HARQ ACKnowledgment/Negative ACKnowledgment (ACK/NACK) signal in response to an uplink transmission.

Control information transmitted on PDCCH is called DCI (downlink control information). Regarding DCI formats, Format 0 is defined for uplink and Format 1, Format 1A, Format 1B, Format 1C, Format 1D, Format 2, Format 2A, Format 3, Format 3A and the like are defined for downlink. Depending on usages, DCI format selectively includes such information as hopping flag, RB assignment, MCS (modulation coding scheme), RV (redundancy version), NDI (new data indicator), TPC (transmit power control), cyclic shift DM RS (demodulation reference signal), CQI (channel quality information) request, HARQ process number, TPMI (transmitted precoding matrix indicator), PMI (precoding matrix indicator) confirmation and the like.

PDCCH carries transmission format and resource allocation information of DL-SCH (downlink shared channel), transmission format and resource allocation information of UL-SCH (uplink shared channel), paging information on PCH (paging channel), system information on DL-SCH, resource allocation information of an upper-layer control message such as a random access response transmitted on PDSCH, Tx power control command set for individual user equipments within a user equipment group, Tx power control command, activation indication information of VoIP (voice over IP) and the like. A plurality of PDCCHs may be transmitted in a control region. A user equipment can monitor a plurality of PDCCHs. PDCCH is transmitted on aggregation of at least one or more contiguous CCEs (control channel elements). In this case, the CCE is a logical assignment unit used to provide PDCCH with a coding rate based on a radio channel state. The CCE corresponds to a plurality of REGs (resource element groups). PDCCH format and the number of PDCCH bits are determined depending on the number of CCEs. A base station determines PDCCH format in accordance with DCI to transmit to a user equipment and attaches CRC (cyclic redundancy check) to control information. The CRC is masked with an identifier (e.g., RNTI (radio network temporary identifier)) in accordance with an owner or a purpose of use. For instance, if PDCCH is provided for a specific user equipment, CRC may be masked with an identifier (e.g., C-RNTI (cell-RNTI)) of the corresponding user equipment. If PDCCH is provided for a paging message, CRC may be masked with a paging identifier (e.g., P-RNTI (paging-RNTI)). If PDCCH is provided for system information (particularly, SIC (system information block)), CRC may be masked with SI-RNTI (system information-RNTI). And, if PDCCH is provided for a random access response, CRC may be masked with RA-RNTI (random access-RNTI).

Figure 5:
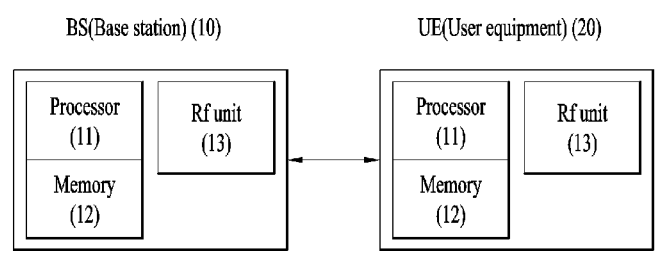
FIG. 5 is a diagram illustrating an exemplary structure of an uplink subframe used in 3GPP LTE/LTE-A system, which is an example of a wireless communication system.

FIG. 5 is a diagram illustrating an exemplary structure of an uplink subframe used in 3GPP LTE/LTE-A system, which is an example of a wireless communication system.

Referring to FIG. 5, a UL subframe includes a plurality of slots (e.g., 2 slots). Each of the slots can include SC-FDMA symbols of which number varies in accordance with a CP length. The UL subframe is divided into a data region and a control region in a frequency domain. The data region includes PUSCH and is used to transmit such a data signal as audio and the like. The control region includes PUCCH and is used to transmit uplink control information (UCI). The PUCCH includes an RB pair situated at both end portions of the data region on a frequency axis and hops using a slot as a boundary.

PUCCH can be used to transmit the following control information.

SR (scheduling request): this is information used to request an uplink UL-SCH resource. This is transmitted by OOK (on-off keying).

HARQ ACK/NACK: This is a response signal for a DL data packet on PDSCH. This indicates whether the DL data packet is successfully received. In response to a single DL codeword, 1-bit ACK/NACK is transmitted. In response to two DL codewords, 2-bit ACK-NACK is transmitted.

CQI (channel quality indicator): This is the feedback information on a DL channel. MIMO (multiple input multiple output) related feedback information includes RI (rank indicator), PMI (precoding matrix indicator), PTI (precoding type indicator) and the like. 20 bits are used per subframe.

A size of control information (UCI) transmittable in a subframe by a user equipment depends on the number of SC-FDMAs available for a control information transmission. The SC-FDMA available for the control information transmission means SC-FDMA symbol remaining after excluding SC-FDMA symbol for a reference signal transmission from a subframe. In case of an SRS (sounding reference signal) configured subframe, a last SC-FDMA symbol of the subframe is excluded as well. A reference signal is used for coherent detection of PUCCH. And, the PUCCH supports 7 formats depending on transmitted informations.

Physical Downlink Control CHannel (PDCCH) Transmission

PDCCH corresponds to a downlink control channel. The PDCCH is configured to transmit control information for transmitting PDSCH/PUSCH for a specific UE and transmit a power control command for a plurality of UEs. The PDCCH occupies maximum 4 OFDM symbols in time domain and PCFICH indicates the number of OFDM symbols assigned to the PDCCH. Meanwhile, the PDCCH is transmitted over system whole band in frequency domain and uses QPSK for modulation. A resource used for transmitting the PDCCH is referred to as a CCE (control channel element). Since the CCE consists of 36 resource elements, it may be able to transmit 72 bits via a single CCE. The amount of control information transmitted on the PDCCH may vary depending on a transmission mode. Control information according to a transmission mode is regulated by a DCI format. A UE determines whether or not PDSCH/PUSCH is transmitted according to a PDCCH decoding result. In this case, PDCCH scrambling is performed using UE ID information (C-RNTI) of a corresponding UE. In particular, if a UE detects a DCI format, which is transmitted in a manner of being scrambled by a UE ID of the UE, the UE transmits PUSCH or receives PDSCH according to PDCCH control information. In general, one subframe includes a plurality of PDCCHs capable of being transmitted. Hence, it is necessary for a UE to check whether or not there is control information transmitted to the UE by performing decoding on a plurality of the PDCCHs. However, if the UE performs decoding on all of a plurality of the PDCCHs, complexity is considerably increased. Hence, the number of performing decoding is limited. When control information is transmitted via PDCCH, the control information can be transmitted in a manner of one CCE or concatenating a plurality of CCEs with each other. This is referred to as CCE aggregation. Currently, a permitted CCE aggregation level is 1, 2, 4 and 8. If the CCE aggregation level corresponds to 4, it indicates that control information of a corresponding UE is transmitted in a manner of concatenating 4 CCEs with each other. A UE sets limit on the decoding number according to each aggregation level. Table 1 in the following shows the decoding number according to an aggregation level.

TABLE 1

| Type | Search space $S_k^{(L)}$ | | Number of PDCCH candidates $M^{(L)}$ |
|---|---|---|---|
| | Aggregation level L | Size [in CCEs] | |
| UE-specific | 1 | 6 | 6 |
| | 2 | 12 | 6 |
| | 4 | 8 | 2 |
| | 8 | 16 | 2 |
| Common | 4 | 16 | 4 |
| | 8 | 16 | 2 |

Referring to Table 1, in case of a common type, a UE performs decoding on PDCCHs, which are transmitted by an aggregation level 4 and 8, 4 times and 2 times, respectively, to determine whether or not control information is transmitted. A specific CCE constructing PDCCH corresponds to a region commonly known to all UEs. In case of a UE-specific type, unlike the common type, a UE performs decoding on PDCCHs, which are transmitted by an aggregation level 1, 2, 4, and 8, 6, 6, 2 and 2 times, respectively, to determine whether or not control information is transmitted. In this case, a CCE is differently configured according to a UE. This can be represented as equation 1 described in the following.

$$Y_k = (A \cdot Y_{k-1}) \bmod D \quad \text{[Equation 1]}$$

In this case, $Y_{-1} = n_{RNTI} \neq 0$, $A=39827$, $D=65537$ and $k = \lfloor n_s/2 \rfloor$. $n_s$ corresponds to a slot number in a radio frame.

Figure 6:
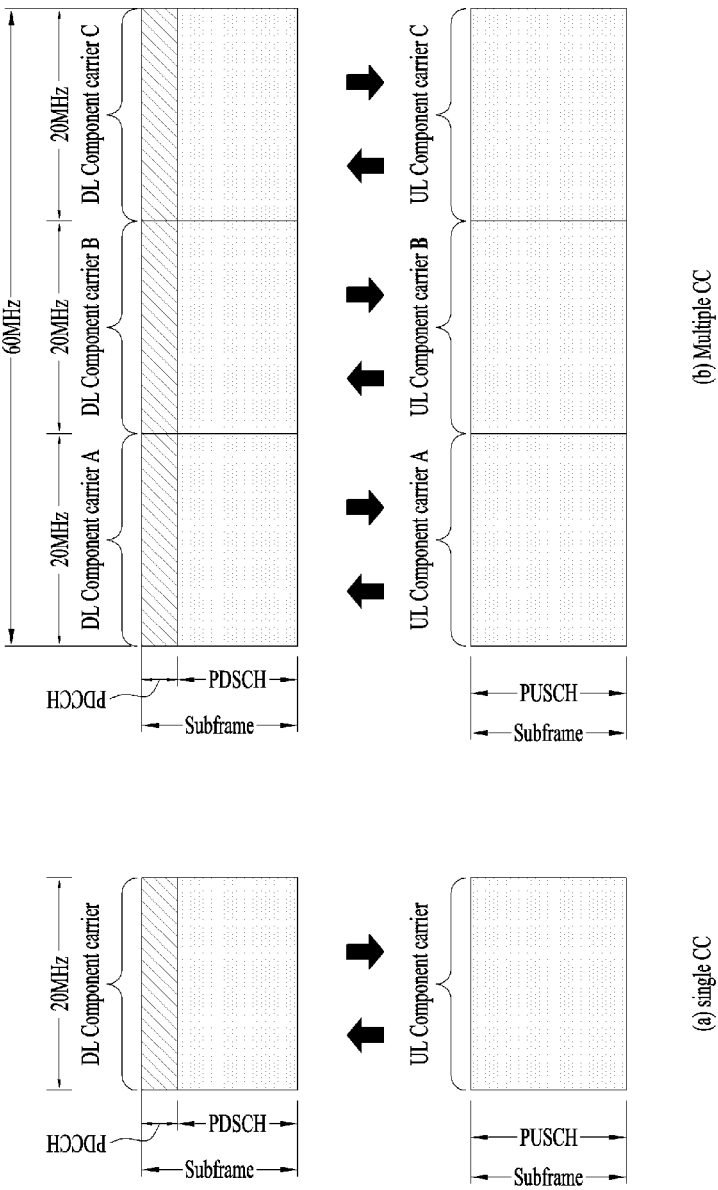
FIG. 6 is a diagram illustrating an example of carrier aggregation used for component carriers (CCs) and the LTE-A system employed in embodiments of the present disclosure.

FIG. 6 is a diagram illustrating an example of component carriers (CCs) used in embodiments of the present disclosure and carrier aggregation used in the LTE-A system.

FIG. 6(a) shows a single carrier structure used in the LTE system. The component carriers include DL CC and UL CC. One CC may have a frequency range of 20 MHz.

FIG. 6(b) shows a carrier aggregation structure used in the LTE-A system. FIG. 6(b) illustrates a case where 3 CCs having a frequency range of 20 MHz are aggregated. While it is illustrated that there are three DL CCs and three UL CCs, the number of DL CCs and UL CCs is not limited. In the case of carrier aggregation, the UE may simultaneously monitor three CCs, receive downlink signals/data, and transmit uplink signals/data.

If N DL CCs are managed in a specific cell, the network may allocate M (M≤N) DL CCs to the UE. In this case, the UE may monitor only M limited DL CCs and receive a DL signal. In addition, the network may assign priorities to L (L≤M≤N) DL CCs to allocate a main DL CC to the UE. In this case, the UE should monitor the L DL CCs. This scheme may be applied to UL transmission in the same manner.

The linkage between the carrier frequency (or DL CC) of a DL resource and the carrier frequency (or UL CC) of a UL resource may be indicated by a highly layer message, such as an RRC message, or system information. For example, a combination of a DL resource and a UL resource may be configured by a linkage defined by System Information Block Type2 (SIB2). Specifically, the linkage may refer to a mapping relationship between a DL CC on which the PDCCH carrying a UL grant is transmitted and a UL CC that uses the UL grant, or a mapping relationship between a DL CC (or UL CC) on which data for HARQ is transmitted and a UL CC (or DL CC) on which a HARQ ACK/NACK signal is transmitted.

Cross Carrier Scheduling

In the carrier aggregation system, scheduling for a carrier or a serving cell is divided into two methods: self-scheduling and cross carrier scheduling. Cross carrier scheduling may be referred to as cross component carrier scheduling or cross cell scheduling.

The self-scheduling means that the PDCCH (UL Grant) and the PDSCH are transmitted on the same DL CC, or that the PUSCH to be transmitted according to the PDCCH (UL Grant) is transmitted on a UL CC linked with the DL CC on which the UL Grant is received.

The cross carrier scheduling means that the PDCCH (DL Grant) and the PDSCH are transmitted on different DL CCs, or that the PUSCH to be transmitted according to the PDCCH (UL Grant) transmitted on a DL CC is transmitted on a UL CC different from the UL CC linked with the DL CC on which the UL grant is received.

The cross-carrier scheduling may be UE-specifically enabled or disabled and may be semi-statically announced for each UE through higher layer signaling (e.g., RRC signaling).

When the cross-carrier scheduling is enabled, a carrier indicator field (CIF) indicating a DL/UL CC through which the PDSCH/PUSCH indicated by the PDCCH is transmitted is required for the PDCCH. For example, the PDCCH may allocate a PDSCH resource or a PUSCH resource to one of multiple CCs using the CIF. That is, the CIF is configured when the PDCCH on the DL CC allocates a PDSCH or PUSCH resource to one of the multi-aggregated DL/UL CCs. In this case, the DCI format of LTE Release-8 may be extended according to the CIF. Here, the configured CIF may be fixed as a 3-bit field or the position of the configured CIF may be fixed regardless of the DCI format size. In addition, the PDCCH structure of LTE Release-8 (resource mapping based on the same CCE and the same coding) may be reused.

On the other hand, when the PDCCH on the DL CC allocates PDSCH resources on the same DL CC or allocates PUSCH resources on a single linked UL CC, the CIF is not configured. In this case, the same PDCCH structure (resource mapping based on the same CCE and the same coding) and DCI format as LTE Release-8 may be used.

When cross carrier scheduling is allowed, the UE needs to monitor PDCCHs for a plurality of DCIs in the control region of a monitoring CC according to the transmission mode and/or bandwidth for each CC. Therefore, configuration of a search space and PDCCH monitoring for supporting such an operation are needed.

In the carrier aggregation system, a UE DL CC set represents a set of DL CCs scheduled for a UE to receive a PDSCH, and a UE UL CC set represents a set of UL CCs scheduled for a UE to transmit a PUSCH. Also, a PDCCH monitoring set represents a set of at least one DL CC on which PDCCH monitoring is performed. The PDCCH monitoring set may be the same as the UE DL CC set or may be a subset of the UE DL CC set. The PDCCH monitoring set may include at least one of the DL CCs in the UE DL CC set. Alternatively, the PDCCH monitoring set may be defined independently of the UE DL CC set. The DL CC included in the PDCCH monitoring set may be configured so as to always enable self-scheduling for the linked UL CC. The UE DL CC set, the UE UL CC set, and the PDCCH monitoring set may be UE-specifically, UE group-specifically, or cell-specifically configured.

When the cross carrier scheduling is disabled, which means that the PDCCH monitoring set is always the same as the DL CC set, no indication such as separate signaling for the PDCCH monitoring set is required. However, when the cross carrier scheduling is enabled, the PDCCH monitoring set may be defined in the UE DL CC set. That is, in order to schedule the PDSCH or the PUSCH for the UE, the BS transmits the PDCCH only through the PDCCH monitoring set.

Figure 7:
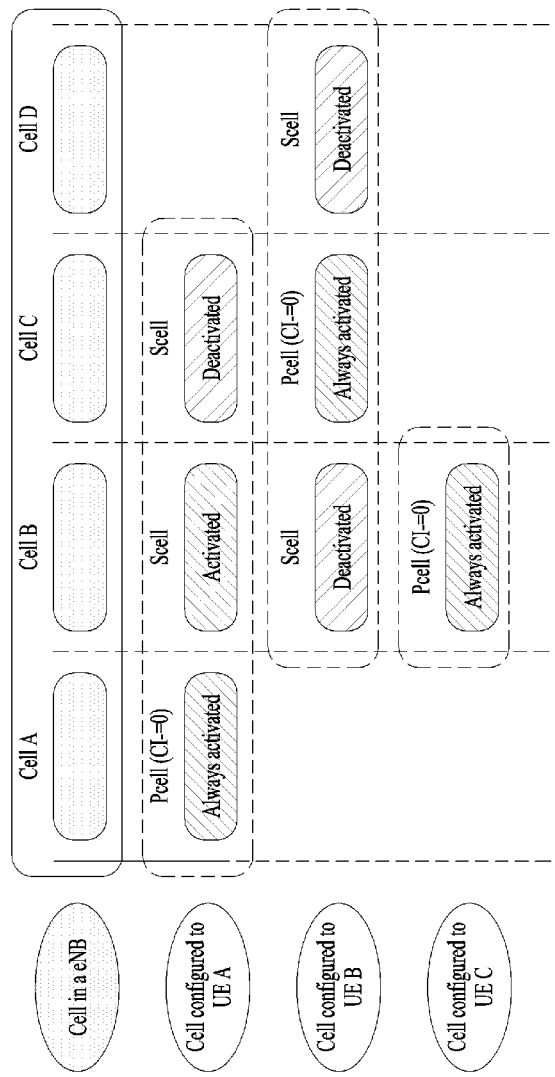
FIG. 7 is a diagram illustrating an example of configuration of a serving cell according to cross carrier scheduling.

FIG. 7 is a diagram illustrating an example of configuration of a serving cell according to cross carrier scheduling.

In a wireless access system supporting carrier aggregation (CA), a BS and/or UEs may be configured with one or more serving cells. In FIG. 7, it is assumed that the BS is capable of supporting four serving cells, which are cell A, cell B, cell C, and cell D, UE A is configured with cells A, B, and C, UE B is configured with cells B, C, and D, and UE C is configured with cell B. Here, at least one of the cells configured for each UE may be configured as a Pcell. The Pcell is always active, and the Scell may be activated or deactivated by the BS and/or the UE.

The cells configured in FIG. 7 are cells that can be added to CA based on a measurement report message from a UE among the cells of the BS, and may be configured for each UE. The configured cells pre-reserve resources for ACK/NACK message transmission for PDSCH signal transmission. An activated cell is a cell configured to actually transmit a PDSCH signal and/or a PUSCH signal among the configured cells, and is used to perform CSI reporting and Sounding Reference Signal (SRS) transmission. A deactivated cell is a cell configured not to transmit/receive a PDSCH/PUSCH signal by a command of a BS or a timer operation. In the deactivated cell, the CSI report and the SRS transmission are also interrupted.

Physical Resource Block (PRB) Bundling

In case of a UE supporting a transmission mode 9, the UE can configure PMI/RI feedback via higher layer. The transmission mode 9 UE to which the PMI/RI feedback is configured may make an assumption on granularity of a physical resource block that applies the same precoding to PDSCH and a DM RS. In particular, the UE performs channel estimation under the assumption that the same precoding is applied to a precoding resource block group (PRG) according to a system bandwidth to enhance channel estimation capability. Table 2 in the following shows values of a PRG size according to a system bandwidth.

TABLE 2

PRG size according to system bandwidth

| System bandwidth ($N_{RB}^{DL}$) | PRG size (PRBs) |
|---|---|
| <=10 | 1 |
| 11~26 | 2 |
| 27~63 | 3 |
| 64~110 | 2 |

Channel Encoding

In a general communication system, in order to make a receiving end correct an error occurred at a channel, a transmitting end performs coding on information transmitted by the transmitting end using a forward error correction code and transmits the information. Having received the information, the receiving end performs demodulation on a reception signal, performs a decoding procedure on the error correction code, and restores the information. An error of the reception signal caused by a channel can be corrected by the decoding procedure. The error correction code may include various types. In the present disclosure, a turbo code is explained as an example of the error correction code. The turbo code consists of a recursive systematic convolution encoder and an interleaver. When the turbo code is actually implemented, an interleaver may exist to easily perform parallel decoding. QPP (quadratic polynomial permutation) is a sort of the interleaver. It is known as the QPP interleaver maintains good performance on a specific data block size only. It is known as the performance of the turbo code is getting better as a size of a data block is getting bigger. In an actual communication system, if a data block has a size equal to or greater than a prescribed size, the data block is divided into a plurality of small data blocks to easily perform encoding. A divided small data block is referred to as a code block. In general, code blocks have the same size. Yet, due to a size restriction of the QPP interleaver, one of a plurality of code blocks may have a different size. The error correction encoding procedure is performed in a unit of a determined interleaver size code block and interleaving is performed to reduce an impact of a burst error, which occurs when transmission is performed via a radio channel. The code block is transmitted in a manner of being mapped to an actual radio resource. Since the amount of radio resources used for performing actual transmission is constant, it is necessary to perform rate matching on the encoded code block to match with the amount of radio resource. In general, rate matching is performed by puncturing or repetition. The rate matching can be performed in such a unit of an encoded code block similar to WCDMA of 3GPP. As a different method, it may be able to separately perform the rate matching in a manner of dividing the encoded code block into a systematic part and a parity part.

Figure 8:
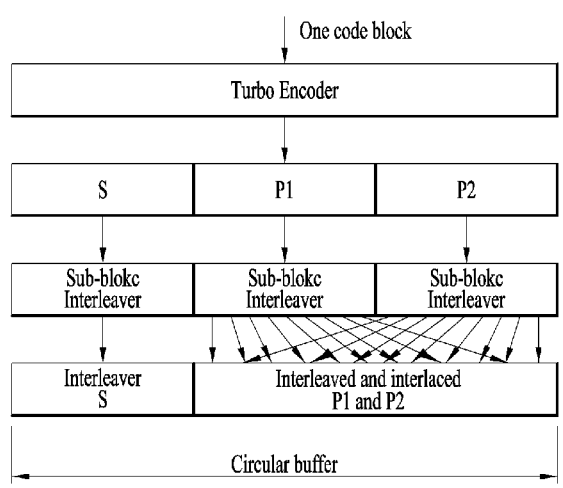
FIG. 8 illustrates rate matching block diagram.

FIG. 8 illustrates rate matching block diagram.

FIG. 8 corresponds to a block diagram for performing rate matching in a manner of dividing an encoded code block into a systematic part and a parity part. In this case, assume that a code rate corresponds to ⅓. In this case, a CRC for detecting an error is attached to a data block transmitted by higher layer. For clarity of implementation, a CRC is attached to a segmented code block as well. It is necessary to define various data block sizes according to a service type of higher layer. Yet, since it is necessary to signal the various data block sizes to a receiving end, quantization is required. When the quantization is performed, in order to match a size of a source data block transmitted by higher later with a size of a data block of a physical layer, a dummy bit is attached. When the quantization is performed, it is preferable to minimize the amount of attached dummy bits. A data block size, modulation and coding rate, and the number of allocated resources become functional relation with each other. In particular, one parameter is determined by values of other two parameters. Hence, in case of signaling parameters, it may signal two parameters only. In the following, for clarity, assume that modulation and coding rate and the number of allocated resources are used to inform a receiving end of a data block size. In this case, a pilot signal or a reference signal for channel estimation, a resource for transmitting control information, and the like may influence on the number of allocated resources according to an antenna configuration. A factor influencing on the number of allocated resources may change at every transmission instant.

Rate Matching

Figure 9:
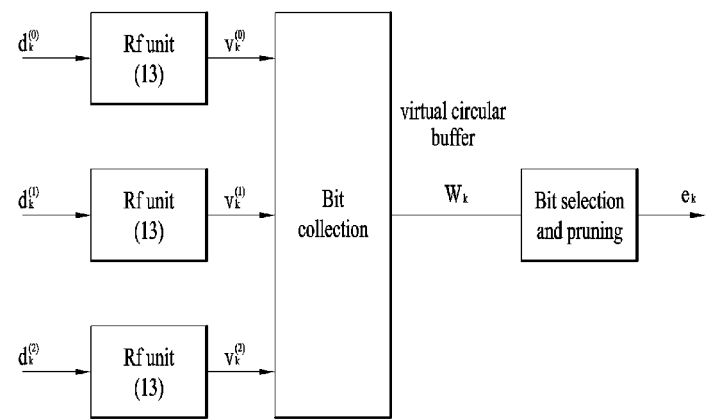
FIG. 9 illustrates rate matching for turbo coded transport channels.

FIG. 9 illustrates rate matching for turbo coded transport channels.

Details of the rate matching for turbo coded transport channels according to FIG. 9 may be represented as shown in Table 3 below.

TABLE 3

The rate matching for turbo coded transport channels is defined per coded block and consists of interleaving the three information bit streams $d_k^{(0)}$, $d_k^{(1)}$ and $d_k^{(2)}$, followed by the collection of bits and the generation of a circular buffer as depicted in FIG. 9. The output bits for each code block are transmitted as described in section 5.1.4.3.2 of 3GPP LTE TS 36.212 standard document. The bit stream $d_k^{(0)}$ is interleaved according to the sub-block interleaver defined in section 5.1.4.3.1 of 3GPP LTE TS 36.212 standard document with an output sequence defined as $v_0^{(0)}, v_1^{(0)}, v_2^{(0)}, \ldots, v_{K_\Pi-1}^{(0)}$ and where $K_\Pi$ is defined in section 5.1.4.3.1 of 3GPP LTE TS 36.212 standard document. The bit stream $d_k^{(1)}$ is interleaved according to the sub-block interleaver defined in section 5.1.4.3.1 of 3GPP LTE TS 36.212 standard document with an output sequence defined as $v_0^{(1)}, v_1^{(1)}, v_2^{(1)}, \ldots, v_{K_\Pi-1}^{(1)}$. The bit stream $d_k^{(2)}$ is interleaved according to the sub-block interleaver defined in section 5.1.4.3.1 with an output sequence defined as $v_0^{(2)}, v_1^{(2)}, v_2^{(2)}, \ldots, v_{K_\Pi-1}^{(2)}$. The sequence of bits $e_k$ for transmission is generated according to section 5.1.4.3.2 of 3GPP LTE TS 36.212 standard document.

Sub-Block Interleaver

Table 4 below shows a specific description of the sub-block interleaver.

TABLE 4

The bits input to the block interleaver are denoted by $d_0^{(i)}, d_1^{(i)}, d_2^{(i)}, \ldots, d_{D-1}^{(i)}$, where D is the number of bits. The output bit sequence from the block interleaver is derived as follows:

(1) Assign $C_{subblock}^{TC} = 32$ to be the number of columns of the matrix. The columns of the matrix are numbered 0, 1, 2, . . . , from left to right.

(2) Determine the number of rows of the matrix $R_{subblock}^{TC}$, by finding minimum integer $R_{subblock}^{TC}$ such that:

$D \leq (R_{subblock}^{TC} \times C_{subblock}^{TC})$

The rows of rectangular matrix are numbered 0, 1, 2, . . . , $R_{subblock}^{TC} - 1$ from top to bottom.

(3) If $(R_{subblock}^{TC} \times C_{subblock}^{TC}) > D$, then $N_D = (R_{subblock}^{TC} \times C_{subblock}^{TC} - D)$ dummy bits are padded such that $y_k = \text{<NULL>}$ for $k = 0, 1, \ldots, N_D - 1$. Then, $y_{N_D + k} = d_k^{(i)}$, $k = 0, 1, \ldots, D - 1$, and the bit sequence $y_k$ is written into the $(R_{subblock}^{TC} \times C_{subblock}^{TC})$ matrix row by row starting with bit $y_0$ in column 0 of row 0:

$$\begin{bmatrix} y_0 & y_1 & y_2 & \cdots & y_{C_{subblock}^{TC}-1} \\ y_{C_{subblock}^{TC}} & y_{C_{subblock}^{TC}+1} & y_{C_{subblock}^{TC}+2} & \cdots & y_{2C_{subblock}^{TC}-1} \\ \vdots & \vdots & \vdots & \ddots & \vdots \\ y_{(R_{subblock}^{TC}-1)\times C_{subblock}^{TC}} & y_{(R_{subblock}^{TC}-1)\times C_{subblock}^{TC}+1} & y_{(R_{subblock}^{TC}-1)\times C_{subblock}^{TC}+2} & \cdots & y_{(R_{subblock}^{TC}\times C_{subblock}^{TC}-1)} \end{bmatrix}$$

For $d_k^{(0)}$ and $d_k^{(1)}$:

(4) Perform the inter-column permutation for the matrix based on the patter $<P(j)>_{j \in \{0, 1, \ldots, C_{subblock}^{TC} - 1\}}$ that is shown in table 3, where P(j) is the original column position of the j-th permuted column. After permutation of the columns, the inter-column permuted $(R_{subblock}^{TC} \times C_{subblock}^{TC})$ matrix is equal to $$\begin{bmatrix} y_{P(0)} & y_{P(1)} & y_{P(2)} & \cdots & y_{P(C_{subblock}^{TC}-1)} \\ y_{P(0)+C_{subblock}^{TC}} & y_{P(1)+C_{subblock}^{TC}} & y_{P(2)+C_{subblock}^{TC}} & \cdots & y_{P(C_{subblock}^{TC}-1)+C_{subblock}^{TC}} \\ \vdots & \vdots & \vdots & \ddots & \vdots \\ y_{P(0)+(R_{subblock}^{TC}-1)\times C_{subblock}^{TC}} & y_{P(1)+(R_{subblock}^{TC}-1)\times C_{subblock}^{TC}} & y_{P(2)+(R_{subblock}^{TC}-1)\times C_{subblock}^{TC}} & \cdots & y_{P(C_{subblock}^{TC}-1)+(R_{subblock}^{TC}-1)\times C_{subblock}^{TC}} \end{bmatrix}$$

(5) The output of the block interleaver is the bit sequence read out column by column from the inter-column permuted $(R_{subblock}^{TC} \times C_{subblock}^{TC})$ matrix. The bits after sub-block interleaving are denoted by $v_0^{(i)}, v_1^{(i)}, v_2^{(i)}, \ldots, v_{K_\Pi - 1}^{(i)}$, where $v_0^{(i)}$ corresponds to $y_{P(0)}$, $v_1^{(i)}$ to $y_{P(0) + C_{subblock}^{TC}}$ . . . and $K_\Pi = (R_{subblock}^{TC} \times C_{subblock}^{TC})$.

For $d_k^{(2)}$:

(4) The output of the sub-block interleaver is denoted by $v_0^{(2)}, v_1^{(2)}, v_2^{(2)}, \ldots, v_{K_\Pi - 1}^{(2)}$, where $v_k^{(2)} = y_{\pi(k)}$ and where $$\pi(k) = \left( P\left( \left\lfloor \frac{k}{R_{subblock}^{TC}} \right\rfloor \right) + C_{subblock}^{TC} \times (k \mod R_{subblock}^{TC}) + 1 \right) \mod K_\Pi$$

Bit Collection, Selection and Transmission

Table 5 shows a specific description of bit collection, selection and transmission.

TABLE 5

The circular buffer of length $K_w = 3K_\Pi$ for the r-th coded block is generated as follows:
$w_k = v_k^{(0)}$ for $k = 0, \ldots, K_\Pi - 1$
$w_{K_\Pi + 2k} = v_k^{(1)}$ for $k = 0, \ldots, K_\Pi - 1$
$w_{K_\Pi + 2k + 1} = v_k^{(2)}$ for $k = 0, \ldots, K_\Pi - 1$
Denote the soft buffer size for the transport block by $N_{IR}$ bits and the soft buffer size for the r-th code block by $N_{cb}$ bits. The size $N_{cb}$ is obtained as follows, where C is the number of code blocks computed in section 5.1.2:

$N_{cb} = \min\left(\left\lfloor\dfrac{N_{IR}}{C}\right\rfloor, K_w\right)$ for DL-SCH transport channels $N_{cb} = K_w$ for UL-SCH transport channels
where $N_{IR}$ is equal to:
$N_{IR} = \left\lfloor \dfrac{N_{soft}}{K_C \cdot K_{MIMO} \cdot \min(M_{DL\_HARQ}, M_{limit})} \right\rfloor$
where:
$N_{soft}$ is the total number of soft channel bits [FFS].
$K_{MIMO}$ is equal to 2 if [FFS condition], and is equal to 1 otherwise.
$M_{DL\_HARQ}$ is the maximum number of DL HARQ processes as defined in section 7 of [3].
$M_{limit}$ is a constant equal to [FFS].
Denoting by E the rate matching output sequence length for the r-th coded block, and $rv_{idx}$ the redundancy version number for this transmission ($rv_{idx}$ = 0, 1, 2 or 3), the rate matching output bit sequence is $e_k$, $k = 0, 1, \ldots, E - 1$.
Define by G the total number of bits available for the transmission of one transport block.
Set $G' = G/(N_L \cdot Q_m)$ where $Q_m$ is equal to 2 for QPSK, 4 for 16QAM, 6 for 64QAM, and where
    For transmit diversity:
      $N_L$ is equal to 2,
    Otherwise:
      $N_L$ is equal to the number of layers a transport block is mapped onto
Set $\gamma = G'$ mod C, where C is the number of code blocks computed in section 5.1.2.
if $r \leq C - \gamma - 1$
  set $E = N_L \cdot Q_m \cdot \lfloor G'/C \rfloor$
else
  set $E = N_L \cdot Q_m \cdot \lceil G'/C \rceil$
end if Set $k_0 = R_{subblock}^{TC} \cdot \left(2 \cdot \left\lceil \dfrac{N_{cb}}{8 R_{subblock}^{TC}} \right\rceil \cdot rv_{idx} + 2\right)$, where $R_{subblock}^{TC}$ is the number of rows defined in section 5.1.4.1.1.
Set k = 0 and j = 0
while $\{k < E\}$
  if $w(k_0 + j)$ mod $N_{cb} \neq$ <NULL>
    $e_k = w(k_0 + j)$ mod Ncb
    k = k + 1
  end if
  j = j + 1
end while LDPC Coding Table 6 below shows a description of LDPC coding.

TABLE 6

The K bits including filler bits ($c_0, c_1, c_2, \ldots, c_{K-1}$) are encoded based on D − K by D parity check matrix (H), where D is number of encoded bits and D − K is the number of parity check bits. The parity check bits ($p_0, p_1, p_2, \ldots, p_{D-K-1}$) are obtained so that $H \cdot d^T = 0$, where $d = (c_0, c_1, c_2, \ldots, c_{K-1}, p_0, p_1, p_2, \ldots, p_{D-K-1})$ is coded bits stream.
The parity check matrix H is defined as:

$$H = \begin{bmatrix} P^{a_{0,0}} & P^{a_{0,1}} & P^{a_{0,2}} & & P^{a_{0,N_{ldpc\_b}-2}} & \\ P^{a_{1,0}} & P^{a_{1,1}} & P^{a_{1,2}} & \ldots & P^{a_{1,N_{ldpc\_b}-2}} & \\ P^{a_{2,0}} & P^{a_{2,1}} & P^{a_{2,2}} & & P^{a_{2,N_{ldpc\_b}-2}} & \\ & \vdots & & \ddots & \vdots & \vdots \\ P^{a_{N_{parity\_b}-1,0}} & P^{a_{N_{parity\_b}-1,1}} & P^{a_{N_{parity\_b}-1,2}} & \ldots & P^{a_{N_{parity\_b}-1,N_{ldpc\_b}-2}} & P \end{bmatrix}$$

where $P^{a_{ij}}$ ($0 \leq i < N_{parity\_b}$, $0 \leq j < N_{ldpc\_b}$) is zero matrix (when $a_{ij} = -1$) or cyclic-permutation matrix obtained from the Z by Z identity matrix by cyclically shifted the columns to the right by $a_{ij}$ elements. The value of Z is shift size obtained by $Z = \lceil K/K_{min} \rceil \cdot 27$ where $K_{min}$ is given in Table 5.1.2-1.
The matrix $P^{a_{ij}}$ is Z by Z zero matrix when $a_{ij}$ is −1. The codeword length D, information length K and number of parity bits D − K is equal to $N_{ldpc\_b} \times Z$, $K_{ldpc\_b} \times Z$ and $N_{pairty\_b} \times Z$,

TABLE 6-continued respectively. The parameters $N_{ldpc\_b}$, $K_{ldpc\_b}$ and $N_{pairty\_b}$ according to code rates are depicted in Table 3.
The parity check matrix is obtained based on Tables 5.1.3.2-2, 5.1.3.2-3, 5.1.3.2-4 and 5.1.3.2-5 which show the exponents ($a_{ij}$) of parity check matrix when the code rate equals 5/6, 3/4, 2/3 and 1/2 for each encoded bits, respectively [5].

Table 7 below shows the parameters of the parity check matrix.

TABLE 7

| Code Rate | $N_{ldpc\_b}$ | $K_{ldpc\_b}$ | $N_{parity\_b}$ |
|---|---|---|---|
| 5/6 | 24 | 20 | 4 |
| 3/4 | 24 | 18 | 6 |
| 2/3 | 24 | 16 | 8 |
| 1/2 | 24 | 12 | 12 |

TABLE 8

Matrix exponents for Code rate R = 5/6

(a) D = 648 bits, Z = 27 bits

| 16 | 17 | 22 | 24 | 9 | 3 | 14 | −1 | 4 | 2 | 7 |
|---|---|---|---|---|---|---|---|---|---|---|
| −1 | 26 | −1 | 2 | −1 | 21 | −1 | 1 | 0 | −1 | |
| −1 | −1 | −1 | | | | | | | | |
| 25 | 12 | 12 | 3 | 3 | 26 | 6 | 21 | −1 | 15 | 22 |
| −1 | 15 | −1 | 4 | −1 | −1 | 16 | −1 | 0 | 0 | |
| −1 | −1 | −1 | | | | | | | | |
| 25 | 18 | 26 | 16 | 22 | 23 | 9 | −1 | 0 | −1 | 4 |
| −1 | 4 | −1 | 8 | 23 | 11 | −1 | −1 | −1 | 0 | |
| 0 | −1 | −1 | | | | | | | | |
| 9 | 7 | 0 | 1 | 17 | −1 | −1 | 7 | 3 | −1 | 3 |
| 23 | −1 | 16 | −1 | −1 | 21 | −1 | 0 | −1 | −1 | |
| 0 | 0 | −1 | | | | | | | | |
| 24 | 5 | 26 | 7 | 1 | −1 | −1 | 15 | 24 | 15 | −1 |
| 8 | −1 | 13 | −1 | 13 | −1 | 11 | −1 | −1 | −1 | |
| −1 | 0 | 0 | | | | | | | | |
| 2 | 2 | 19 | 14 | 24 | 1 | 15 | 19 | −1 | 21 | −1 |
| 2 | −1 | 24 | −1 | 3 | −1 | 2 | 1 | −1 | −1 | |
| −1 | −1 | 0 | | | | | | | | |

(b) D =1296 bits, Z = 54 bits

| 39 | 40 | 51 | 41 | 3 | 29 | 8 | 36 | −1 | 14 | −1 |
|---|---|---|---|---|---|---|---|---|---|---|
| 6 | −1 | 33 | −1 | 11 | −1 | 4 | 1 | 0 | −1 | |
| −1 | −1 | −1 | | | | | | | | |
| 48 | 21 | 47 | 9 | 48 | 35 | 51 | −1 | 38 | −1 | 28 |
| −1 | 34 | −1 | 50 | −1 | 50 | −1 | −1 | 0 | 0 | |
| −1 | −1 | −1 | | | | | | | | |
| 30 | 39 | 28 | 42 | 50 | 39 | 5 | 17 | −1 | 6 | −1 |
| 18 | −1 | 20 | −1 | 15 | −1 | 40 | −1 | −1 | 0 | |
| 0 | −1 | −1 | | | | | | | | |
| 29 | 0 | 1 | 43 | 36 | 30 | 47 | −1 | 49 | −1 | 47 |
| −1 | 3 | −1 | 35 | −1 | 34 | −1 | 0 | −1 | −1 | |
| 0 | 0 | −1 | | | | | | | | |
| 1 | 32 | 11 | 23 | 10 | 44 | 12 | 7 | −1 | 48 | −1 |
| 4 | −1 | 9 | −1 | 17 | −1 | 16 | −1 | −1 | −1 | |
| −1 | 0 | 0 | | | | | | | | |
| 13 | 7 | 15 | 47 | 23 | 16 | 47 | −1 | 43 | −1 | 29 |
| −1 | 52 | −1 | 2 | −1 | 53 | −1 | 1 | −1 | −1 | |
| −1 | −1 | 0 | | | | | | | | |

(c) D =1944 bits, Z = 81 bits

| 48 | 29 | 28 | 39 | 9 | 61 | −1 | −1 | −1 | 63 | 45 |
|---|---|---|---|---|---|---|---|---|---|---|
| 80 | −1 | −1 | −1 | 37 | 32 | 22 | 1 | 0 | −1 | |
| −1 | −1 | −1 | | | | | | | | |
| 4 | 49 | 42 | 48 | 11 | 30 | −1 | −1 | −1 | 49 | 17 |
| 41 | 37 | −1 | 15 | −1 | 54 | −1 | −1 | 0 | 0 | |
| −1 | −1 | −1 | | | | | | | | |
| 35 | 76 | 78 | 51 | 37 | 35 | 21 | −1 | 17 | 64 | −1 |
| −1 | −1 | 59 | 7 | −1 | −1 | 32 | −1 | −1 | 0 | |
| 0 | −1 | −1 | | | | | | | | |

TABLE 8-continued

Matrix exponents for Code rate R = 5/6

| 9 | 65 | 44 | 9 | 54 | 56 | 73 | 34 | 42 | −1 | −1 |
|---|---|---|---|---|---|---|---|---|---|---|
| −1 | 35 | −1 | −1 | −1 | 46 | 39 | 0 | −1 | −1 | |
| 0 | 0 | −1 | | | | | | | | |
| 3 | 62 | 7 | 80 | 68 | 26 | −1 | 80 | 55 | −1 | 36 |
| −1 | 26 | −1 | 9 | −1 | 72 | −1 | −1 | −1 | −1 | |
| −1 | 0 | 0 | | | | | | | | |
| 26 | 75 | 33 | 21 | 69 | 59 | 3 | 38 | −1 | −1 | −1 |
| 35 | −1 | 62 | 36 | 26 | −1 | −1 | 1 | −1 | −1 | |
| −1 | −1 | 0 | | | | | | | | |

TABLE 9

Matrix exponents for R = 3/4

(a) D = 648 bits, Z = 27 bits

| 16 | 17 | 22 | 24 | 9 | 3 | 14 | −1 | 4 | 2 | 7 |
|---|---|---|---|---|---|---|---|---|---|---|
| −1 | 26 | −1 | 2 | −1 | 21 | −1 | 1 | 0 | −1 | |
| −1 | −1 | −1 | | | | | | | | |
| 25 | 12 | 12 | 3 | 3 | 26 | 6 | 21 | −1 | 15 | 22 |
| −1 | 15 | −1 | 4 | −1 | −1 | 16 | −1 | 0 | 0 | |
| −1 | −1 | −1 | | | | | | | | |
| 25 | 18 | 26 | 16 | 22 | 23 | 9 | −1 | 0 | −1 | 4 |
| −1 | 4 | −1 | 8 | 23 | 11 | −1 | −1 | −1 | 0 | |
| 0 | −1 | −1 | | | | | | | | |
| 9 | 7 | 0 | 1 | 17 | −1 | −1 | 7 | 3 | −1 | 3 |
| 23 | −1 | 16 | −1 | −1 | 21 | −1 | 0 | −1 | −1 | |
| 0 | 0 | −1 | | | | | | | | |
| 24 | 5 | 26 | 7 | 1 | −1 | −1 | 15 | 24 | 15 | −1 |
| 8 | −1 | 13 | −1 | 13 | −1 | 11 | −1 | −1 | −1 | |
| −1 | 0 | 0 | | | | | | | | |
| 2 | 2 | 19 | 14 | 24 | 1 | 15 | 19 | −1 | 21 | −1 |
| 2 | −1 | 24 | −1 | 3 | −1 | 2 | 1 | −1 | −1 | |
| −1 | −1 | 0 | | | | | | | | |

(b) D = 1296 bits, Z = 54 bits

| 39 | 40 | 51 | 41 | 3 | 29 | 8 | 36 | −1 | 14 | −1 |
|---|---|---|---|---|---|---|---|---|---|---|
| 6 | −1 | 33 | −1 | 11 | −1 | 4 | 1 | 0 | −1 | |
| −1 | −1 | −1 | | | | | | | | |
| 48 | 21 | 47 | 9 | 48 | 35 | 51 | −1 | 38 | −1 | 28 |
| −1 | 34 | −1 | 50 | −1 | 50 | −1 | −1 | 0 | 0 | |
| −1 | −1 | −1 | | | | | | | | |
| 30 | 39 | 28 | 42 | 50 | 39 | 5 | 17 | −1 | 6 | −1 |
| 18 | −1 | 20 | −1 | 15 | −1 | 40 | −1 | −1 | 0 | |
| 0 | −1 | −1 | | | | | | | | |
| 29 | 0 | 1 | 43 | 36 | 30 | 47 | −1 | 49 | −1 | 47 |
| −1 | 3 | −1 | 35 | −1 | 34 | −1 | 0 | −1 | −1 | |
| 0 | 0 | −1 | | | | | | | | |
| 1 | 32 | 11 | 23 | 10 | 44 | 12 | 7 | −1 | 48 | −1 |
| 4 | −1 | 9 | −1 | 17 | −1 | 16 | −1 | −1 | −1 | |
| −1 | 0 | 0 | | | | | | | | |
| 13 | 7 | 15 | 47 | 23 | 16 | 47 | −1 | 43 | −1 | 29 |
| −1 | 52 | −1 | 2 | −1 | 53 | −1 | 1 | −1 | −1 | |
| −1 | −1 | 0 | | | | | | | | |

(c) D = 1944 bits, Z = 81 bits

| 48 | 29 | 28 | 39 | 9 | 61 | −1 | −1 | −1 | 63 | 45 |
|---|---|---|---|---|---|---|---|---|---|---|
| 80 | −1 | −1 | −1 | 37 | 32 | 22 | 1 | 0 | −1 | |
| −1 | −1 | −1 | | | | | | | | |
| 4 | 49 | 42 | 48 | 11 | 30 | −1 | −1 | −1 | 49 | 17 |
| 41 | 37 | −1 | 15 | −1 | 54 | −1 | −1 | 0 | 0 | |
| −1 | −1 | −1 | | | | | | | | |
| 35 | 76 | 78 | 51 | 37 | 35 | 21 | −1 | 17 | 64 | −1 |
| −1 | −1 | 59 | 7 | −1 | −1 | 32 | −1 | −1 | 0 | |
| 0 | −1 | −1 | | | | | | | | |

TABLE 9-continued

Matrix exponents for R = ¾

```
 9  65  44   9  54  56  73  34  42  -1  -1
-1  35  -1  -1  -1  46  39   0  -1  -1
 0   0  -1
 3  62   7  80  68  26  -1  80  55  -1  36
-1  26  -1   9  -1  72  -1  -1  -1  -1
-1   0   0
26  75  33  21  69  59   3  38  -1  -1  -1
35  -1  62  36  26  -1  -1   1  -1  -1
-1  -1   0
```

TABLE 10

Matrix exponents for Code rate R= ⅔

(a) D = 648 bits, Z = 27 bits

```
25  26  14  -1  20  -1   2  -1   4  -1  -1
 8  -1  16  -1  18   1   0  -1  -1  -1
-1  -1  -1
10   9  15  11  -1   0  -1   1  -1  -1  18
-1   8  -1  10  -1  -1   0   0  -1  -1
-1  -1  -1
16   2  20  26  21  -1   6  -1   1  26  -1
 7  -1  -1  -1  -1  -1  -1  -1   0   0  -1
-1  -1  -1
10  13   5   0  -1   3  -1   7  -1  -1  26
-1  -1  13  -1  16  -1  -1  -1   0   0
-1  -1  -1
23  14  24  -1  12  -1  19  -1  17  -1  -1
-1  20  -1  21  -1   0  -1  -1  -1   0
 0  -1  -1
 6  22   9  20  -1  25  -1  17  -1   8  -1
14  -1  18  -1  -1  -1  -1  -1  -1  -1
 0   0  -1
14  23  21  11  20  -1  24  -1  18  -1  19
-1  -1  -1  -1  22  -1  -1  -1  -1  -1
-1   0   0
17  11  11  20  -1  21  -1  26  -1   3  -1
-1  18  -1  26  -1   1  -1  -1  -1  -1
-1  -1   0
```

(b) D = 1296 bits, Z = 54 bits

```
39  31  22  43  -1  40   4  -1  11  -1  -1
50  -1  -1  -1   6   1   0  -1  -1  -1
-1  -1  -1
25  52  41   2   6  -1  14  -1  34  -1  -1
-1  24  -1  37  -1  -1   0   0  -1  -1
-1  -1  -1
43  31  29   0  21  -1  28  -1  -1   2  -1
-1   7  -1  17  -1  -1  -1   0   0  -1
-1  -1  -1
20  33  48  -1   4  13  -1  26  -1  -1  22
-1  -1  46  42  -1  -1  -1  -1  -1   0   0
-1  -1  -1
45   7  18  51  12  25  -1  -1  -1  50  -1
-1   5  -1  -1  -1   0  -1  -1  -1  -1   0
 0  -1  -1
35  40  32  16   5  -1  -1  18  -1  -1  43
51  -1  32  -1  -1  -1  -1  -1  -1  -1  -1
 0   0  -1
 9  24  13  22  28  -1  -1  37  -1  -1  25
-1  -1  52  -1  13  -1  -1  -1  -1  -1
-1   0   0
32  22   4  21  16  -1  -1  -1  27  28  -1
38  -1  -1  -1   8   1  -1  -1  -1  -1
-1  -1   0
```

(c) D = 1944 bits, Z = 81 bits

```
61  75   4  63  56  -1  -1  -1  -1  -1  -1
 8  -1   2  17  25   1   0  -1  -1  -1
-1  -1  -1
56  74  77  20  -1  -1  -1  64  24   4  67
-1   7  -1  -1  -1  -1   0   0  -1  -1
-1  -1  -1
```

TABLE 10-continued

Matrix exponents for Code rate R= ⅔

```
28  21  68  10   7  14  65  -1  -1  -1  23
-1  -1  -1  75  -1  -1  -1   0   0  -1
-1  -1  -1
48  38  43  78  76  -1  -1  -1  -1   5  36
-1  15  72  -1  -1  -1  -1  -1   0   0
-1  -1  -1
40   2  53  25  -1  52  62  -1  20  -1  -1
44  -1  -1  -1  -1   0  -1  -1  -1   0
 0  -1  -1
69  23  64  10  22  -1  21  -1  -1  -1  -1
-1  68  23  29  -1  -1  -1  -1  -1  -1
 0   0  -1
12   0  68  20  55  61  -1  40  -1  -1  -1
52  -1  -1  -1  44  -1  -1  -1  -1  -1
-1   0   0
58   8  34  64  78  -1  -1  11  78  24  -1
-1  -1  -1  -1  58   1  -1  -1  -1  -1
-1  -1   0
```

TABLE 11

Matrix exponents for Code rate R = ½

(a) D = 648 bits, Z = 27 bits

```
 0  -1  -1  -1   0   0  -1  -1   0  -1  -1
 0   1   0  -1  -1  -1  -1  -1  -1  -1
-1  -1  -1
22   0  -1  -1  17  -1   0   0  12  -1  -1
-1  -1  -1   0  -1  -1  -1  -1  -1  -1
-1  -1  -1
 6  -1   0  -1  10  -1  -1  -1  24  -1   0
-1  -1  -1   0  -1  -1  -1  -1  -1  -1
-1  -1  -1
 2  -1  -1   0  20  -1  -1  -1  25   0  -1
-1  -1  -1  -1   0  -1  -1  -1  -1  -1
-1  -1  -1
23  -1  -1  -1   3  -1  -1  -1   0  -1   9
11  -1  -1  -1  -1   0   0  -1  -1  -1
-1  -1  -1
24  -1  23   1  17  -1   3  -1  10  -1  -1
-1  -1  -1  -1  -1  -1   0   0  -1  -1
-1  -1  -1
25  -1  -1  -1   8  -1  -1  -1   7  18  -1
-1   0  -1  -1  -1  -1  -1   0   0  -1
-1  -1  -1
13  24  -1  -1   0  -1   8  -1   6  -1  -1
-1  -1  -1  -1  -1  -1  -1  -1  -1   0   0
-1  -1  -1
 7  20  -1  16  22  10  -1  -1  23  -1  -1
-1  -1  -1  -1  -1  -1  -1  -1  -1  -1   0
 0  -1  -1
11  -1  -1  -1  19  -1  -1  -1  13  -1   3
17   0   0  -1  -1  -1  -1  -1  -1  -1
 0   0  -1
25  -1   8  -1  23  18  -1  14   9  -1  -1
-1  -1  -1  -1  -1  -1  -1  -1  -1  -1
-1   0   0
 3  -1  -1  -1  16  -1  -1   2  25   5  -1
-1   1  -1  -1  -1  -1  -1  -1  -1  -1
-1  -1   0
```

(b) D = 1296 bits, Z = 54 bits

```
40   1  -1  -1  22  -1  49  23  43  -1  -1
-1   1   0  -1  -1  -1  -1  -1  -1  -1
-1  -1  -1
50   1  -1  -1  48  35  -1  -1  13  -1  30
-1  -1   0   0  -1  -1  -1  -1  -1  -1
-1  -1  -1
39  50  -1  -1   4  -1   2  -1  -1  -1  -1
49  -1   0   0  -1  -1  -1  -1  -1  -1
-1  -1  -1
33  -1  -1  38  37  -1  -1   4   1  -1  -1
-1  -1  -1  -1   0   0  -1  -1  -1  -1
-1  -1  -1
```

TABLE 11-continued

Matrix exponents for Code rate R = ½

| 45 | −1 | −1 | −1 | 0  | 22 | −1 | −1 | 20 | 42 | −1 |
|    | −1 | −1 | −1 | −1 | −1 | 0  | 0  | −1 | −1 | −1 |
|    | −1 | −1 | −1 |    |    |    |    |    |    |    |
| 51 | −1 | −1 | 48 | 35 | −1 | −1 | −1 | 44 | −1 | 18 |
|    | −1 | −1 | −1 | −1 | −1 | −1 | 0  | 0  | −1 | −1 |
|    | −1 | −1 | −1 |    |    |    |    |    |    |    |
| 47 | 11 | −1 | −1 | −1 | 17 | −1 | −1 | 51 | −1 | −1 |
|    | −1 | 0  | −1 | −1 | −1 | −1 | −1 | 0  | 0  | −1 |
|    | −1 | −1 | −1 |    |    |    |    |    |    |    |
| 5  | −1 | 25 | −1 | 6  | −1 | 45 | −1 | 13 | 40 | −1 |
|    | −1 | −1 | −1 | −1 | −1 | −1 | −1 | −1 | 0  | 0  |
|    | −1 | −1 | −1 |    |    |    |    |    |    |    |
| 33 | −1 | −1 | 34 | 24 | −1 | −1 | −1 | 23 | −1 | −1 |
|    | 46 | −1 | −1 | −1 | −1 | −1 | −1 | −1 | −1 | 0  |
|    | 0  | −1 | −1 |    |    |    |    |    |    |    |
| 1  | −1 | 27 | −1 | 1  | −1 | −1 | −1 | 38 | −1 | 44 |
|    | −1 | −1 | −1 | −1 | −1 | −1 | −1 | −1 | −1 | −1 |
|    | 0  | 0  | −1 |    |    |    |    |    |    |    |
| −1 | 18 | −1 | −1 | 23 | −1 | −1 | 8  | 0  | 35 | −1 |
|    | −1 | −1 | −1 | −1 | −1 | −1 | −1 | 0  | −1 | −1 |
|    | −1 | 0  | 0  |    |    |    |    |    |    |    |
| 49 | −1 | 17 | −1 | 30 | −1 | −1 | −1 | 34 | −1 | −1 |
|    | 19 | 1  | −1 | −1 | −1 | −1 | −1 | −1 | −1 | −1 |
|    | −1 | −1 | 0  |    |    |    |    |    |    |    |

(c) D = 1944 bits, Z = 81 bits

| 57 | −1 | −1 | −1 | 50 | −1 | 11 | −1 | 50 | −1 | 79 |
|    | −1 | 1  | 0  | −1 | −1 | −1 | −1 | −1 | −1 | −1 |
|    | −1 | −1 | −1 |    |    |    |    |    |    |    |
| 3  | −1 | 28 | −1 | 0  | −1 | −1 | −1 | 55 | 7  | −1 |
|    | −1 | −1 | 0  | 0  | −1 | −1 | −1 | −1 | −1 | −1 |
|    | −1 | −1 | −1 |    |    |    |    |    |    |    |
| 30 | −1 | −1 | −1 | 24 | 37 | −1 | −1 | 56 | 14 | −1 |
|    | −1 | −1 | −1 | 0  | 0  | −1 | −1 | −1 | −1 | −1 |
|    | −1 | −1 | −1 |    |    |    |    |    |    |    |
| 62 | 53 | −1 | −1 | 53 | −1 | −1 | 3  | 35 | −1 | −1 |
|    | −1 | −1 | −1 | −1 | 0  | 0  | −1 | −1 | −1 | −1 |
|    | −1 | −1 | −1 |    |    |    |    |    |    |    |
| 40 | −1 | −1 | 20 | 66 | −1 | −1 | 22 | 28 | −1 | −1 |
|    | −1 | −1 | −1 | −1 | −1 | 0  | 0  | −1 | −1 | −1 |
|    | −1 | −1 | −1 |    |    |    |    |    |    |    |
| 0  | −1 | −1 | −1 | 8  | −1 | 42 | −1 | 50 | −1 | −1 |
|    | 8  | −1 | −1 | −1 | −1 | −1 | 0  | 0  | −1 | −1 |
|    | −1 | −1 | −1 |    |    |    |    |    |    |    |
| 69 | 79 | 79 | −1 | −1 | −1 | 56 | −1 | 52 | −1 | −1 |
|    | −1 | 0  | −1 | −1 | −1 | −1 | −1 | 0  | 0  | −1 |
|    | −1 | −1 | −1 |    |    |    |    |    |    |    |
| 65 | −1 | −1 | −1 | 38 | 57 | −1 | −1 | 72 | −1 | 27 |
|    | −1 | −1 | −1 | −1 | −1 | −1 | −1 | −1 | 0  | 0  |
|    | −1 | −1 | −1 |    |    |    |    |    |    |    |
| 64 | −1 | −1 | −1 | 14 | 52 | −1 | −1 | 30 | −1 | −1 |
|    | 32 | −1 | −1 | −1 | −1 | −1 | −1 | −1 | −1 | 0  |
|    | 0  | −1 | −1 |    |    |    |    |    |    |    |
| −1 | 45 | −1 | 70 | 0  | −1 | −1 | −1 | 77 | 9  | −1 |
|    | −1 | −1 | −1 | −1 | −1 | −1 | −1 | −1 | −1 | −1 |
|    | 0  | 0  | −1 |    |    |    |    |    |    |    |
| 2  | 56 | −1 | 57 | 35 | −1 | −1 | −1 | −1 | −1 | 12 |
|    | −1 | −1 | −1 | −1 | −1 | −1 | −1 | −1 | −1 | −1 |
|    | −1 | 0  | 0  |    |    |    |    |    |    |    |
| 24 | −1 | 61 | −1 | 60 | −1 | −1 | 27 | 51 | −1 | −1 |
|    | 16 | 1  | −1 | −1 | −1 | −1 | −1 | −1 | −1 | −1 |
|    | −1 | −1 | 0  |    |    |    |    |    |    |    |

When an LDPC code is introduced, if an encoder is designed without a restriction on a payload size, it is unable to satisfy required performance due to such a restriction as processing capability of a receiver, performance gain, decoding latency, and the like. Hence, it may be efficient to perform encoding in a manner of segmenting a payload size equal to or greater than a specific threshold value into a plurality of code blocks less than the threshold value.

Figure 10:
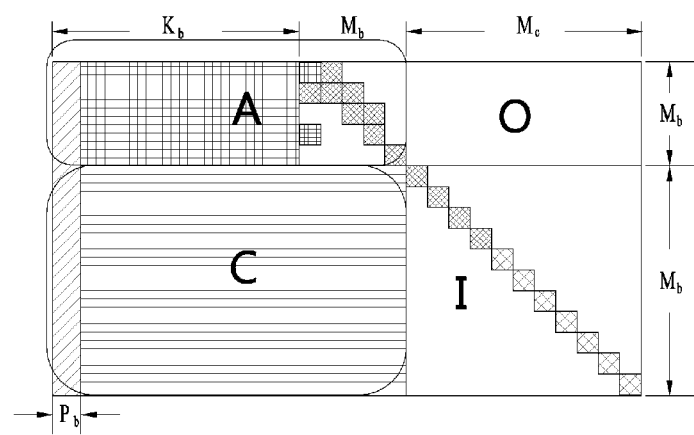
FIG. 10 is a diagram illustrating the conceptual structure of multi-edge low-density parity check (ME-LDPC) codes.

FIG. 10 is a diagram illustrating the conceptual structure of multi-edge LDPC (ME-LDPC) codes.

In FIG. 10, K represents an LDPC code information length, $M_b$ represents parity of a mother code, and $M_c$ represents parity of a single parity check code. For convenience of description, the parity of the mother code is referred to as an M1 parity and the single parity is referred to as an M2 parity bit. Unlike the M1 parity, M2 parity encoding may be calculated only if a row connected to a corresponding parity is present.

An LDPC encoded bit is written into a circular buffer for HARQ/rate matching. A maximum size Lmax of the circular buffer is defined as about three times a maximum information size, i.e., three times 8448 (=22×384 where Kbmax=22 and Zmax=384). Therefore, the maximum size Lmax of the circular buffer becomes about 25,344+A bits (hereinafter, referred to as 25K bits). 'A' corresponds to 2×384 when systematic puncturing bits are stored in an additional memory. If the systematic puncturing bits are not stored, 'A' becomes '0'. For information smaller than 8448 bits, if the buffer of 25K bits is maximally used, a minimum code rate becomes lower than ⅓. Assuming that a minimum code rate Rmin of the mother code is ⅕, a code rate supportable in the circular buffer is changed to ⅓ to ⅕ according to information size. In this case, the range of Z for supporting a specific information block size is Z≤Zmax and the range of a mother code rate r is ⅕≤r≤⅓. A redundancy version (RV) designates a specific location of the circular buffer to indicate a starting point during initial transmission or retransmission. As described above, the size of the circular buffer is determined according to the Z value (or minimum code rate) supporting a corresponding information block size. Therefore, when the RV is designated as a value which does not vary with the information block size and the Z value, there is an advantage of efficiently indicating the RV with respect to various information block sizes. That is, since the information block size may be represented as Kb*Z, the circular buffer size becomes min(Lmax, Kb*Z/r). Accordingly, if Kb is equally divided by the supported number of RVs, RVs may be designated with respect to various information block sizes regardless of the Z value or the mother code rate r. For example, when Kb=22, RV0 may be defined as 1, RV1 may be defined as 5 or 6, RV2 may be defined as 11, and RV3 may be defined as 16 or 17.

Figure 11:
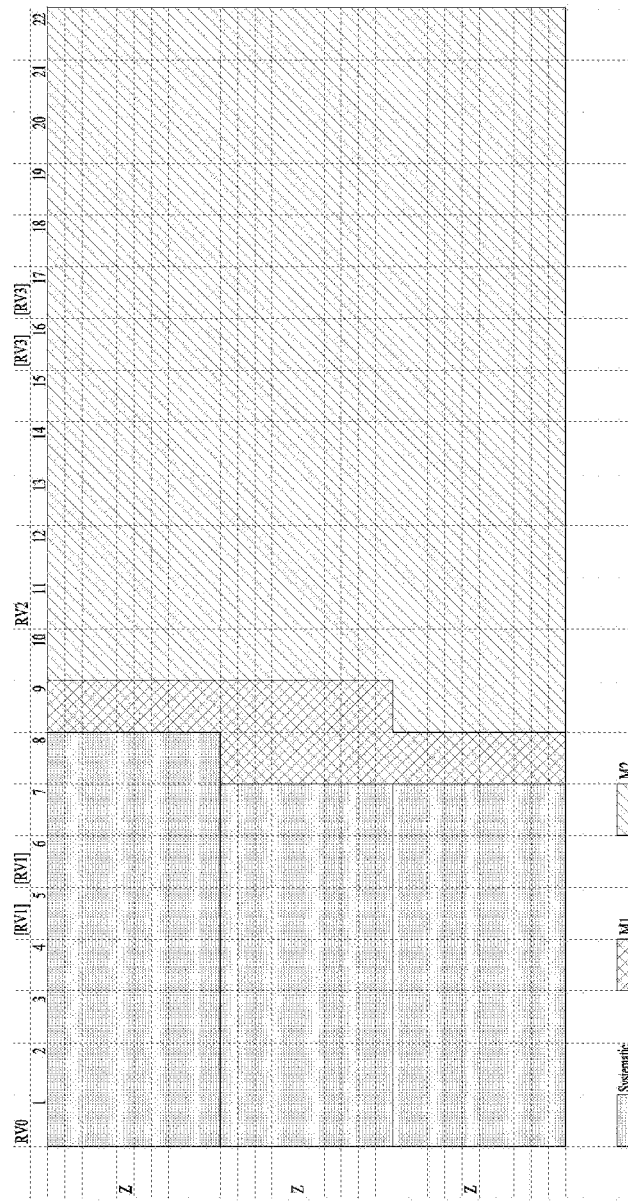
FIG. 11 is a diagram illustrating an example of indicating a circular buffer and an RV for a mother code rate r of ⅓.

FIG. 11 is a diagram illustrating an example of indicating a circular buffer and an RV for a mother code rate r of ⅓.

Writing is performed column-by-column into the circular buffer in order of systematic=>M1 parity=>M2 parity bits and reading is performed column-by-column. In the case of an LDPC, since some systematic bits (e.g., 2Z) may be punctured for transmission during initial transmission, an offset corresponding to the amount of punctured bits may be applied to the starting position of RV0. The offset may also be applied to the other RVs.

Figure 12:
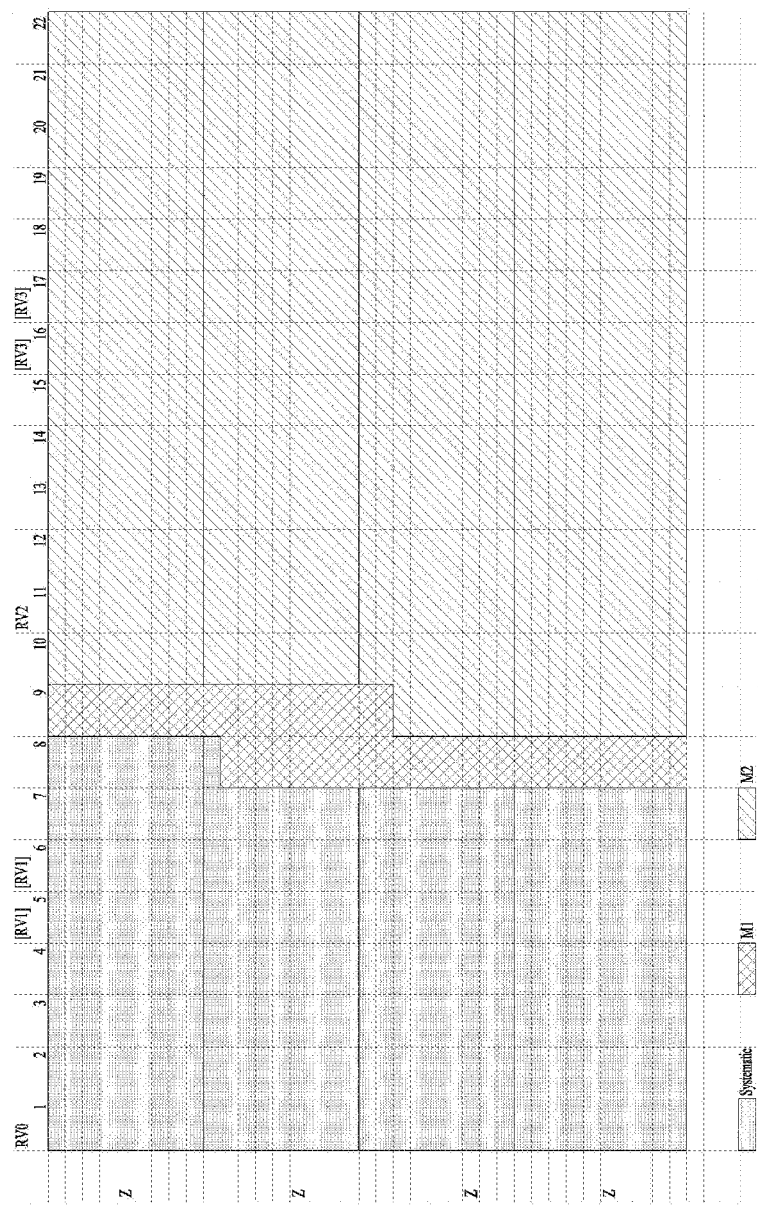
FIG. 12 is a diagram illustrating an example of indicating a circular buffer and an RV for a mother code rate r of ¼.

FIG. 12 is a diagram illustrating an example of indicating a circular buffer and an RV for a mother code rate r of ¼.

The circular buffer size of FIG. 11 and the circular buffer size of FIG. 12 are equal. Identically to FIG. 11, writing is performed column-by-column into the circular buffer in order of systematic=>M1 parity=>M2 parity bits and reading is performed column-by-column Limited buffer rate matching (LBRM) excludes some of coded bits of the circular buffer corresponding to the mother code rate from a transmit buffer. Since this has an effect of physically increasing the mother code rate, the complexity of a memory of a receiver decreases and processing burden is reduced, thereby resulting in gain of implementation. However, the increased mother code rate may cause performance degradation. Generally, a transport block size (TBS) affected by LBRM differs according to the size of coded bits of the circular buffer defined by LBRM. That is, if the size of the coded bits of the circular buffer can support the mother code rate when LBRM is not applied, it is desirable that the TBS apply full buffer rate matching. In general, a code rate that may support a maximum TBS is the mother code rate changed by LBRM.

LBRM may be signaled in various ways. DL LBRM may be generally defined as a UE category. Since DL LBRM is related to UE implementation, DL LBRM is defined as a capability to facilitate UE implementation. UL LBRM is associated with gNB implementation. Generally, gNB implementation may be more free from an area or cost than UE implementation. However, the LDPC is disadvantageous in that decoder throughput decreases as the mother code rate is lowered. Therefore, even if the gNB has a degree of freedom of implementation as compared with the UE, support for UL LBRM may cause gain in gNB implementation. In particular, as compared with an LTE turbo code having the mother code rate of ⅓, decoder throughput of the LDPC having the mother code rate of ⅓ is degraded. In this case, whether to apply UL LBRM may be indicated in various ways. For example, the gNB may insert or add a field indicating whether to apply LBRM to downlink control information (DCI) or may semi-statically indicate whether to apply LBRM to the UE through MAC/RRC signaling. As another example of a method of indicating whether to apply LBRM to the DCI, a plurality of mother code rates of LBRM may be configured and a mother code rate to be applied at a corresponding scheduling time may be indicated.

It may be assumed that LBRM is applied per HARQ process. In this case, it is desirable that mother code rates according to LBRM be the same for respective HARQ processes.

When the gNB indicates (or configures) whether to apply LBRM to the UE through RRC signaling, the following scheme 1, scheme 2, and scheme 3 may be considered.

Scheme 1: A mother code rate supported by LBRM may be indicated or configured. Multiple mother code rates may be configured and a specific mother code rate may be indicated or configured to be used for LBRM. The UE should use a specific configured mother code rate for LBRM. A specific mother code rate among the configured mother code rates may be designated as a default mother code rate.

Scheme 2: A maximum value of the TBS supported by LBRM may be indicated or configured. This effect is equivalent to limiting the size of coded bits used in an actual circular buffer. In the case of LBRM, a plurality of (maximum) TBSs may be configured and a specific (maximum) TBS thereamong may be indicated or configured to be used for LBRM. A specific TBS among configured (maximum) TBSs may be designated as a default TBS.

Scheme 1 and Scheme 2 may be applied altogether.

Scheme 3: Activation of LBRM is indicated and a default rate matching scheme is configured. When whether to apply LBRM is configured through RRC signaling, there is a transition duration in transmitting and receiving sides when whether to apply LBRM is changed. It is necessary to configure the default rate matching scheme to be used during this transition duration. As an example, an LBRM scheme supporting a specific mother code rate and/or a maximum TBS may be configured as the default rate matching scheme. As another example, a full buffer rate matching scheme that does not apply LBRM may be configured as a default rate matching scheme. Alternatively, the gNB may be configured to assume default rate matching when a PUSCH is scheduled through a PDCCH having a specific DCI format.

TBS Design For LDPC

An LDPC encoder may be defined by a parity check matrix H. That is, an H matrix may be defined for an information bit length D and a code rate r. The encoded bit length D is defined as 648, 1296, or 1944 bits and the code rate (=payload size/codeword size) is defined as ⅚, ¾, ⅔, or ½. Therefore, 12 H matrices are defined by a combination of (D, r). In this case, H may be defined as a (D−K)×D matrix, where D is an encoded bit size, K is a payload size, and D and K may be defined as $D=N_{ldpc}*Z$ and $K=K_{ldpc}*Z$, respectively. The payload size K supported by the 12 H matrices may be calculated by an equation of D*r and supports payload sizes of {324, 432, 486, 540, 648, 864, 972, 989, 1080, 1319, 1484, 1648} bits. LDPC coding for an undefined encoded bit length may be supported by a shortening and puncturing method. For example, when LDPC encoding of ½ is performed on a payload size of 600 bits, D becomes 1200 bits. In this case, since r=½, an H matrix of a combination of (1296, ½) is used. If 48 bits among 648 information bits are set to 0, 48 bits of encoded bits become 0 due to a systematic structure and 48 bits among the remaining 1248 bits are punctured, thereby generating 1200 bits.

Figure 13:
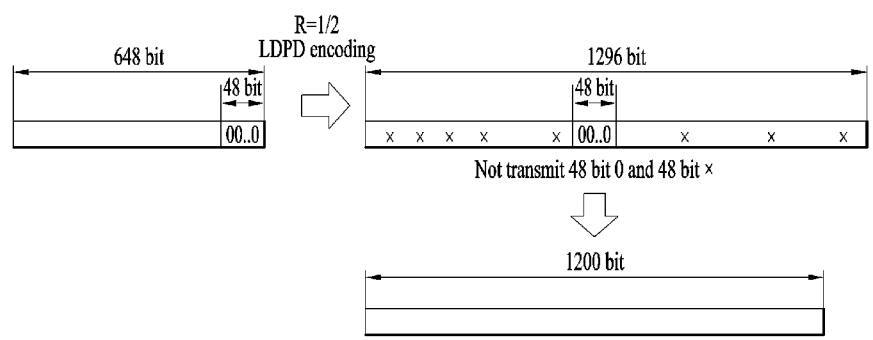
FIG. 13 is a diagram illustrating an example of various payload sizes supported using shortening/puncturing.

FIG. 13 is a diagram illustrating an example of various payload sizes supported using shortening/puncturing.

As described above, if M (=M1×M2) H matrices are defined, M combinations of (D, r) or (K, r) are supported. To support other code rates and payload sizes, a rate matching procedure of shortening/puncturing/repetition should be performed. Here, it is assumed that D or K supports M1 matrices and r supports M2 matrices. In addition, since an information block size corresponding to $K_{ldpc}*Z$ may be supported by defining a plurality of values of Z for a specific H matrix, the information block size of $K_{ldpc}*Z$ may also be a payload size supported by the H matrix. In this case, the information block size may include a CRC. When a finite number of H matrices is defined, the present disclosure proposes a method of segmenting a payload size exceeding a specific threshold into a plurality of code blocks. After code block segmentation, the CRC may be added to a code block. Generally, since encoding is performed in units of code blocks, it is desirable that code block sizes be equal. However, if shortening/puncturing/repetition is performed, there may be considerable performance degradation and thus segmentation into code blocks of unequal sizes may be performed.

Figure 14:
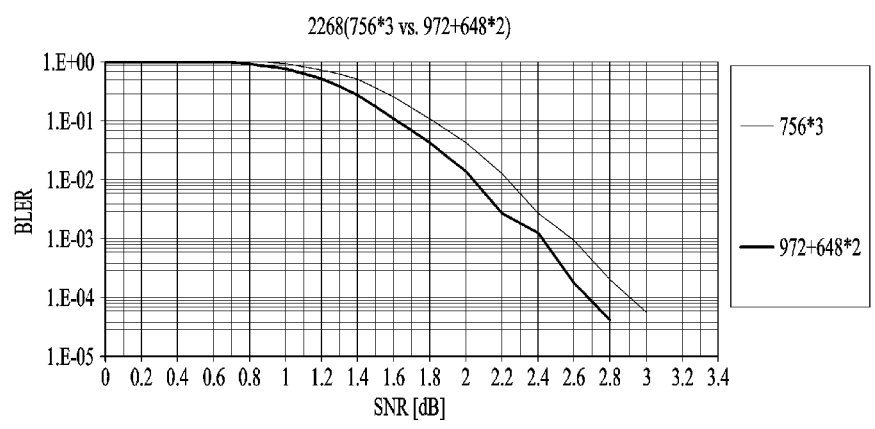
FIG. 14 illustrates performance comparison between segmentation using the same code block and segmentation using a different code block for an LDPC encoder.

FIG. 14 is a diagram illustrating performance comparison between segmentation using the same code block size and segmentation using different code block sizes for an LDPC encoder.

In this case, it is assumed that code block segmentation is performed when a payload size is 1648 bits or greater and the payload size is 2268 bits. The 2268 bits may be segmented into three equally sized code blocks each having 756 bits or into one code block of a payload size of 972 bits supported by the defined H matrix and two code blocks each of a payload size of 648 bits. In this case, 756 bits may be encoded through shortening using an H matrix for 972 bits. As may be seen in FIG. 11, segmentation using a code block size corresponding to a part of payload sizes supported by the H matrix exhibits good performance The following code block segmentation scheme may be considered based on the performance result of FIG. 14.

Even if segmentation is performed, it is desirable that segmentation be performed such that the number of code blocks is minimized.

(1) Since performance is better as the length of a code block becomes longer, segmentation is performed to make the code block as long as possible. (2) Overhead may be increased because a CB CRC may be added to every code block (e.g., LTE turbo code). However, when an LDPC code is used, the CB CRC may be replaced with a syndrome check.

It is desirable to perform segmentation using a payload size supported by the H matrix. In this case, since the H matrix may vary with a code rate, it is desirable to consider a code rate that may be obtained from control information when performing code block segmentation. When a code rate $r_t$ used for actual transmission satisfies $r_n \leq r_t < r_{n+1}$, n=1, ..., M2, it is desirable to perform segmentation using a payload size supported by the H matrix corresponding to one code rate selected from between $r_n$ and $r_{n+1}$ based on a specific criterion.

Segmentation is performed using the same code block size supported by the H matrix. When a payload (=transport block) size is defined, the payload size may be defined such that the payload size is a code block size supported by the H matrix. In this case, $K+CRC_{TB}=N*(K_n+CRC_{CB})$, where n=1, ..., M. Here, $CRC_{TB}$ and $CRC_{CB}$ denote CRC lengths added respectively to a transport block and a code block, and N denotes the number of segmented code blocks. If a plurality of values of Z is supported, K may be determined such that $K_n$ may be a code block size supported by the H matrix, when $K+CRC_{TB}=K_{ldpc}*Z=N*(K_n+CRC_{CB})$, $K_{ldpc}$ is a base matrix, and n=1, ..., M.

When segmentation is performed using the same code block size, if a payload size is not supported by the H matrix, segmentation is performed using different code block sizes supported by the H matrix. In this case, it is desirable to minimize the number of different code block sizes. For example, the number of different code block sizes may be limited to 2 or 3. When the payload (=transport block) size is defined, the payload size may be defined such that the payload size is the sum of code blocks of different sizes supported by the H matrix. When taking into consideration two code blocks of different sizes, $K+CRC_{TB}=N1*(K_{n1}+CRC_{CB})+N2*(K_{n2}+CRC_{CB})$, where n1 and n2=1, ..., M, $CRC_{TB}$ and $CRC_{CB}$ denote CRC lengths added respectively, to a transport block and to a code block, and N1 and N2 denote the number of code blocks segmented by sizes of $K_{n1}$ and $K_{n2}$, respectively.

When segmentation using different payload sizes supported by the H matrix is not performed, segmentation is performed using a code block corresponding to the sum of sizes of segmented code blocks closely approximating the payload size. In this case, the number of payload bits corresponding to a difference between the sum of sizes of segmented code blocks and the payload size may be processed as follows.

Method 1: The payload bits are allocated to a specific code block and a codeword length is adjusted using rate matching such as shortening/puncturing/repetition. Method 1-1: When segmentation into code blocks of different sizes is performed, the payload bits are allocated to one code block among code blocks corresponding to a specific code block size. Method 1-2: When segmentation into code blocks of different sizes is performed, the payload bits are allocated as equally as possible to all code blocks of code blocks corresponding to a specific code block size.

Method 2: The payload bits are allocated as equally as possible to all code blocks and a codeword length is adjusted using rate matching. Method 2-1: The number of bits allocated to each code block is allocated in proportion to the number of code blocks and each bit is allocated to a specific code block of each code block size. Method 2-2: The number of bits allocated to each code block is allocated in proportion to the number of code blocks and bits allocated to code blocks of each code block are allocated as equally as possible.

Scheme of Determining Code Block Size Supported by H Matrix

When no puncturing is assumed, the code block size may be expressed as $Z*K_{ldpc}$ (including a CRC length). When various values of Z are designed, available code block sizes may also have various values. If shortening is used, granularity of the code block size may be more diverse. However, since too much shortening may cause performance degradation, it is desirable to limit the amount of shortening to a certain value or below. For example, the amount of shortening may be limited to a value equal to or less than a multiple of a particular Z value, i.e., $X*Z$ (e.g., X=6). This may be determined by considering the degree of performance degradation and the granularity of the supported code block size. In addition, although shortening is performed in units of one bit, when the code block size is defined in units of one bit, the number of code block sizes is increased, resulting in increases in costs for the test of the UE. Therefore, the amount of shortening allowed for code block sizes of an equal interval may be limited. When a set of supported Z values is {Z1, Z2, Z3, ... ], Zn}, it is assumed that the relationship of Z1>Z2> . . . >Zn is satisfied. If shortening of Z1*c, Z1*(2c), Z1*(3c), . . . is allowed by designating a constant c, the code block sizes are $Z1*Z*K_{ldpc}$, $Z1*K_{ldpc}-Z1*c$, $Z1*K_{ldpc}-Z1*(2c)$, $Z1*K_{ldpc}-Z1*(3c)$. In this case, shortening is performed such that the amount of shortening is smaller than $X*Z1$. Here, m may be selected so as to satisfy the relationship of $Z1*K_{ldpc}-Z1*(mc)>Z2*K_{ldpc}$. The same principle may be applied to {Zn} where n>1.

Table 12 below shows an example of code block sizes supported when $K_{ldpc}=32$, a set of values of Z is {256, 224, 192, 160, 128, 112, 96, 80, 64, 56, 48, 40, 32, 28, 24, 20, 16, 14, 12, 10, 8, 6, 4}, a maximum code block size is 819, and c=0.5.

TABLE 12

Example of code block sizes ($K_{ldpc}$ = 32, a set of Z: {256, 224, 192, 160, 128, 112, 96, 80, 64, 56, 48, 40, 32, 28, 24, 20, 16, 14, 12, 10, 8, 6, 4}, maximum code block size = 8192, and c = 0.5)

| Z | Code block size |
|---|---|
| 256 | 8192, 8064, 7936, 7808, 7680, 7552, 7424, 7296 |
| 224 | 7168, 7056, 6944, 6832, 6720, 6608, 6496, 6384, 6272, [6160] |
| 192 | 6144, 5952, 5856, 5760, 5664, 5568, 5472, 5376, 5280, 5184 |
| 160 | 5120, 5040, 4960, 4880, 4800, 4720, 4640, 4560, 4480, 4400, 4320, 4240, 4160 |
| 128 | 4096, 4032, 3968, 3904, 3840, 3776, 3712, 3648 |
| 112 | 3584, 3528, 3472, 3416, 3360, 3304, 3248, 3192, 3136 |
| 96 | 3072, 3024, 2976, 2928, 2880, 2832, 2784, 2736, 2688, 2640, 2592 |
| 80 | 2560, 2520, 2480, 2440, 2400, 2360, 2320, 2280, 2240, 2200, 2160, 2120, 2080 |
| 64 | 2048, 2016, 1984, 1952, 1920, 1888, 1856, 1824 |
| 56 | 1792, 1764, 1736, 1708, 1680, 1652, 1624, 1596, 1568, [1540] |
| 48 | 1536, 1512, 1488, 1464, 1440, 1416, 1392, 1368, 1344, 1320, 1296 |
| 40 | 1280, 1260, 1240, 1220, 1200, 1180, 1160, 1140, 1120, 1100, 1080, 1060, 1040 |

TABLE 12-continued

Example of code block sizes ($K_{ldpc}$ = 32, a set of Z: {256, 224, 192, 160, 128, 112, 96, 80, 64, 56, 48, 40, 32, 28, 24, 20, 16, 14, 12, 10, 8, 6, 4}, maximum code block size = 8192, and c = 0.5)

| Z | Code block size |
|---|---|
| 32 | 1024, 1008, 992, 976, 960, 944, 928, 912 |
| 28 | 896, 882, 868, 854, 840, 826, 812, 798, 784, [770] |
| 24 | 768, 756, 744, 732, 720, 708, 696, 684, 672, 660 |
| 20 | 640, 630, 620, 610, 600, 590, 580, 570, 560, 550, 540, 530, 520 |
| 16 | 512, 504, 496, 488, 480, 472, 464, 456 |
| 14 | 448, 441, 434, 427, 420, 413, 406, 399, 392, [385] |
| 12 | 384, 378, 372, 366, 360, 354, 348, 342, 336, 330, [324] |
| 10 | 320, 315, 310, 305, 300, 295, 290, 285, 280, 275, 270, 265, 260 |
| 8 | 256, 252, 248, 244, 240, 236, 232, 228, 224, 220, 216, 212, 208 |
| 6 | 192, 189, 186, 183, 180, 177, 174, 171, 168, 165, 162, 159, 156, 153 |
| 4 | 128, 126, 124, 122, 120, 118, 116, 114, 112, 110, 108, 106, 104, 102 |

In Table 12, code block sizes indicated by [ ] may not be supported. In Table 12, the constant c may be set to different values according to Z or multiple sets of Z (the same value within a set). A granularity of a code block size may differ according to multiple sets of Z (the same granularity in a set). A transport block (TB) of a transport block size (TBS)>8192 may be segmented into code block sizes of Table 12.

TABLE 13

Example of code block sizes ($K_{ldpc}$ = 22, a set of Z: {384, 352, 320, 288, 256, 240, 224, 208, 192, 176, 160, 144, 128, 120, 112, 104, 96, 88, 80, 72, 64, 60, 56, 52, 48, 44, 40, 36, 32, 30, 28, 26, 24, 22, 20, 18, 16, 15, 14, 13, 12, 11, 10, 9, 8, 7, 6, 5, 4, 3, 2}, and maximum code block size = 8448)

| Z | Code block size (CBS) range |
|---|---|
| 384 | 7743 <= CBS <= 8848 |
| 352 | 7041 <= CBS <= 7744 |
| 320 | 6337 <= CBS <= 7040 |
| 288 | 5633 <= CBS <= 6336 |
| 256 | 5281 <= CBS <= 5632 |
| 240 | 4927 <= CBS <= 5280 |
| 224 | 4577 <= CBS <= 4928 |
| 208 | 4225 <= CBS <= 4576 |
| 192 | 3873 <= CBS <= 4224 |
| 176 | 3521 <= CBS <= 3872 |
| 160 | 3169 <= CBS <= 3520 |
| 144 | 2817 <= CBS <= 3168 |
| 128 | 2641 <= CBS <= 2816 |
| 120 | 2465 <= CBS <= 2640 |
| 112 | 2289 <= CBS <= 2464 |
| 104 | 2113 <= CBS <= 2288 |
| 96 | 1937 <= CBS <= 2112 |
| 88 | 1761 <= CBS <= 1936 |
| 80 | 1585 <= CBS <= 1760 |
| 72 | 1409 <= CBS <= 1584 |
| 64 | 1321 <= CBS <= 1408 |
| 60 | 1233 <= CBS <= 1320 |
| 56 | 1145 <= CBS <= 1232 |
| 52 | 1057 <= CBS <= 1144 |
| 48 | 969 <= CBS <= 1056 |
| 44 | 881 <= CBS <= 968 |
| 40 | 793 <= CBS <= 880 |
| 36 | 705 <= CBS <= 792 |
| 32 | 661 <= CBS <= 704 |
| 30 | 617 <= CBS <= 660 |
| 28 | 573 <= CBS <= 616 |
| 26 | 529 <= CBS <= 572 |
| 24 | 485 <= CBS <= 528 |
| 22 | 441 <= CBS <= 484 |
| 20 | 397 <= CBS <= 440 |
| 18 | 353 <= CBS <= 396 |
| 16 | 331 <= CBS <= 352 |
| 15 | 309 <= CBS <= 330 |
| 14 | 287 <= CBS <= 308 |
| 13 | 265 <= CBS <= 286 |
| 12 | 243 <= CBS <= 264 |
| 11 | 221 <= CBS <= 242 |
| 10 | 199 <= CBS <= 220 |
| 9 | 177 <= CBS <= 198 |
| 8 | 155 <= CBS <= 176 |
| 7 | 133 <= CBS <= 154 |
| 6 | 111 <= CBS <= 132 |
| 5 | 89 <= CBS <= 110 |
| 4 | 67 <= CBS <= 88 |
| 3 | 45 <= CBS <= 66 |
| 2 | CBS <= 44 |

A TB satisfying TBS>8448 may be segmented into code blocks of a code block size (CBS) of Table 13 in the above-mentioned manner. Only a part of CBSs of Table 13 may also be supported. A part of values of Z of Table 13 may not be supported. In this case, the range of the CBS may be adjusted in consideration of supported values of Z. For example, when it is assumed that Z=352 is not supported, 7041≤CBS≤8448 may be supported by Z=384. In this case, the amount of shortening is relatively increased. If other values of Z are not supported, values of Z corresponding to the range of the CBS may be configured or designated using the same scheme.

Mapping of the CBS ranges and values of Z in Table 13 may be applied to a specific value of Z or to the CBS equal to or greater than a specific CBS. The is because, when the CBS is small, increasing the value of Z and the amount of shortening may cause good performance. For example, mapping of Table 13 may be used only when the value of Z is 24 or the CBS is equal to or greater than 512. In Table 12, only CBSs corresponding to multiples of 8 may be allowed. Considering that data is processed in a MAC layer in units of bytes, there is an advantage of efficiently operating a system by minimizing padding. Assuming that a TB-level CRC is 24 bits and a TBS satisfies Equation 2 below, the CBS may be segmented to have the same size.

$$TBS + CRC_{TB} = N_{CB} * CBS \qquad \text{[Equation 2]}$$

In Equation 2, a CBS includes a CRC size. $N_{CB}$ denotes the number of CBs and $CRC_{TB}$ denotes a CRC length added to a TB. When Equation 2 is satisfied and a CBS in 8-bit units is supported, TBSs corresponding to Table 14 below may be supported. TBSs corresponding to a part of Table 14 may also be supported.

TABLE 14

Example of a set of TBSs when segmentation is performed
into up to 11 code blocks supported when a bit-level
CBS is assumed and a TB-level CRC is 24 bits

| $N_{CB}$ | TBS |
|---|---|
| 2 | TBS = 8440 + 2*k, (k = 0, . . . , 4216) |
| 3 | TBS = 12672 + 3*k, (k = 0, . . . , 4216) |
| 4 | TBS = 16904 + 4*k, (k = 0, . . . , 4216) |
| 5 | TBS = 21136 + 5*k, (k = 0, . . . , 4216) |
| 6 | TBS = 25368 + 6*k, (k = 0, . . . , 4216) |
| 7 | TBS = 29600 + 7*k, (k = 0, . . . , 4216) |
| 8 | TBS = 33832+ 8*k, (k = 0, . . . , 4216) |
| 9 | TBS = 38064 + 9*k, (k = 0, . . . , 4216) |
| 10 | TBS = 42296 + 10*k, (k = 0, . . . , 4216) |
| 11 | TBS = 46528 + 11*k, (k = 0, . . . , 4216) |

Even in the case of segmentation into a greater number of code blocks, a TBS supported by the same principle may be defined.

When transmitting a TB using an LDPC code, a plurality of base graphs (BGs) (e.g., H matrices) may be defined.

Figure 15:
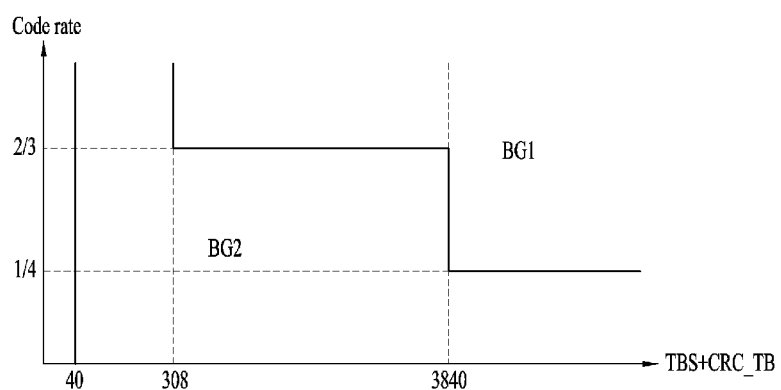
FIG. 15 is a chart showing a criterion for selecting a base graph in transmitting a transport block using two base graphs.

FIG. 15 is a chart showing a criterion for selecting a base graph in transmitting a TB using two base graphs.

Referring to FIG. 15, a TBS represents a transport block size and CRC_TB represents a CRC length added to a TB and has 16 bits for TBS<3824 and 24 bits for the other cases. For BG1 and BG2, reference may be made to definitions of Table 5.3.2-1, Table 5.3.2-2, and Table 5.3.2-3 of the specification 38.212 v1.1.0 [6]. Assuming that a minimum size of TBS+CRC_TB is 40 bits, BG2 is used for 40<=TBS+CRC_TB<=308. For 308<TBS+CRC_TB<=3840, whether to use BG1 or BG2 is determined based on a code rate of ⅔. For TBS+CRC_TB>3840, whether to use BG1 or BG2 is determined based on a code rate of ¼. If BG1 is used, code block segmentation is performed when TBS+CRC_TB>8448 and, if BG2 is used, code block segmentation is performed when TBS+CRC_TB>3840.

BG1 and BG2 may be simultaneously or selectively supported according to UE capability/category. Since a UE supporting only BG1 may not use BG2 even if code rate <¼, the UE performs only code block segmentation using BG1. That is, during segmentation, the number of code blocks may be calculated as ceil(TBS+CRC_TB/(8448−24)). Likewise, since a UE supporting only BG2 may not use code block segmentation of BG1, the UE performs segmentation using BG2. That is, the number of code blocks during segmentation may be calculated as ceil(TBS+CRC_TB/ (3840−24)). For the UE supporting BG1 and BG2 simultaneously or selectively, it is desirable to perform segmentation into code blocks of the same size without zero padding. This is because a zero padding bit does not include information. When code block segmentation is performed using BG1 or BG2, segmentation into code blocks of the same size may be performed if Equation 3 and Equation 4 blow are satisfied.

$$TBS+CRC\_TB=N1*CBS \quad \text{[Equation 3]}$$

$$TBS+CRC\_TB=N2*CBS \quad \text{[Equation 4]}$$

In Equation 3 and Equation 4, N1 and N2 denote the number of code blocks when code block segmentation is performed using BG1 and BG2, and CBS denotes a value that does not include a code block CRC length (e.g., 24 bits). To perform segmentation into code blocks of the same size that do not generate zero padding regardless of a UE that simultaneously or selectively supports BG1 and BG2, it is desirable to define TBS+CRC_TB satisfying both Equation 3 and Equation 4 with respect to a TB corresponding to 3840<TBS+CRC_TB in FIG. 12. That is, if it is assumed that a TB is assumed to be byte-aligned, the TB is a multiple of 8. If a TBS is designed such that TBS+CRC_TB is a multiple of a least common multiple of (8, N1, N2), Equation 3 and Equation 4 may be satisfied without zero padding. That is, when N1=2 and N2=3, since a least common multiple of (8, 2, 3) is 24, it is desirable to design TBS+CRC_TB as a multiple of 24.

Table 15 below shows an example of TBS+CRC_TB satisfying Equation 3 and Equation 4 without zero padding according to the range of TBS+CRC_TB. In Table 15, TBS granularity example 1 represents a minimum granularity of a TBS satisfying Equation 3 and Equation 4 and TBS granularity example 2 represents an example of increasing a granularity as a TBS among granularities satisfying Equation 3 and Equation 4 is increased. A maximum CBS on which code block segmentation using BG2 is performed may vary with a maximum MCS index with code rate<¼ in an MCS table and with the amount of available resources (e.g., the number of resource elements (REs)). For example, assuming that 120 REs per RB and 75 REs per RB are present and the MCS table is present, a maximum TBS of generating code block segmentation using BG2 is about 19200 bits. A TBS greater than the TBS on which segmentation using BG2 is performed may be designed to satisfy a granularity of a multiple of a least common multiple of (8, N1).

TABLE 15

Condition of TBS + CRC_TB for code block segmentation of the same size without zero padding (CRC_TB = 24)

| Input bit sequence (B) = TBS + CRC_TB | Number of CBs (BG1) | Number of CBs (BG2) | TBS granularity example 1 (grn) | TBS granularity example 2 (grn) |
|---|---|---|---|---|
| 3824 < B <= 7632 | 1 | 2 | 8 | 8 |
| 7632 < B <= 8448 | 1 | 3 | 24 | 24 |
| 8448 < B <= 11448 | 2 | 3 | 24 | 24 |
| 11448 < B <= 15264 | 2 | 4 | 8 | 24 |
| 15264 < B <= 16848 | 2 | 5 | 40 | 40 |
| 16848 < B <= 19080 | 3 | 5 | 40 | 40 |
| 19080 < B <= 22896 | 3 | 6 | 24 | 96 |
| 22896 < B <= 25272 | 3 | 7 | 168 | 168 |
| 25272 < B <= 26712 | 4 | 7 | 56 | 168 |
| 26712 < B <= 30528 | 4 | 8 | 8 | 168 |

The size of TBS+CRC_TB based on Table 15 may be indicated as Equation 5 and Equation 6.

$$TBS + \text{CRC\_TB} = grn\left\lceil \frac{N_{RE} \cdot v \cdot Q_m \cdot R}{grn} \right\rceil \quad \text{[Equation 5]}$$

$$TBS + \text{CRC\_TB} = grn\left\lfloor \frac{N_{RE} \cdot v \cdot Q_m \cdot R}{grn} \right\rfloor \quad \text{[Equation 6]}$$

In Equation 5 and Equation 6, v denotes the number of layers, $Q_m$ denotes a modulation order obtained from an MCS index, R denotes a code rate acquired from the MCS index, $N_{RE}$ denotes the number of REs, $N_{RE}$=Y*number of PRBs scheduled (#PRBs_scheduled), and grn denotes a value indicated in the granularity example of Table 15.

For the UE supporting only BG1 or BG2, a TBS at which zero padding does not occur is desirably designed to be a multiple of a least common multiple of (8, N1) or (8, N2), respectively.

The following embodiments describe code block segmentation for a payload size of 1648 bits or more with respect to an LDPC encoder. It is assumed that a CRC size added to a TB and a code block is 24.

Embodiment 1) TBS K=1920 and code rate r=¾

If a 24-bit CRC is added, since 1944>1648, code block segmentation is performed. CBSs supported for the code rate of r=¾ are 486, 972, and 1458 bits. Since an equation of 1992=2*(972+24) is satisfied, segmentation is performed into two code blocks each having a size of 972 bits.

Embodiment 2) TBS K=1668 and code rate r=½

If a 24-bit CRC is added, since 1692>1648, code block segmentation is performed. CBSs supported for the code rate r=½ are 324, 648, and 972 bits. Since an equation of 1692=2*(822+24) is satisfied, segmentation may be performed into two code blocks each having a size of 846 bits. However, since this CBS is not a size supported for r=½, segmentation is performed into code blocks having different sizes. Since an equation of 1692=2*648+324 is satisfied, segmentation is performed into two code blocks each having 648 bits and one code block of 324 bits.

Embodiment 3) TBS K=1916 and code rate r=½

If a 24-bit CRC is added, since 1940>1648, code block segmentation is performed. CBSs supported for the code rate r=½ are 324, 648, and 972 bits. Since 1940=2*970, although segmentation into two code blocks each having a size of 970 bits may be performed, this size is not a CBS supported for r=½. Since 1940=2*972-4, segmentation into two code blocks each having 972 bits is performed and then a specific code block may be shortened by 4 bits or each of the code blocks may be shortened by 2 bits, thereby generating encoded bits.

The transmitting/receiving side (e.g., UE/gNB) may be configured to transmit HARQ-ACK for a plurality of code blocks. That is, after P code blocks are decoded, ACK may be transmitted only when the all the coded blocks are successfully decoded. Otherwise, NACK may be transmitted. This may prevent system efficiency from being lowered during retransmission of a transport block unit when there are a large number of code blocks constituting a TB. That is, system efficiency may be improved by performing retransmission only for a code block group (CBG) (a CBG consists of one or more code blocks) in which an error occurs. In this case, the number P of code blocks for which HARQ-ACK is transmitted may be configured through a higher layer or higher layer signaling (e.g., RRC signaling). However, when the value of P is reconfigured through higher layer signaling, ambiguity arises in the value of P between the transmitting side and the receiving side. Therefore, a fallback operation may be performed to transmit HARQ-ACK with a default P value. That is, during a higher layer reconfiguration duration, the receiving side may transmit HARQ-ACK by assuming a specific value of P. In this case, a DL control channel for scheduling corresponding user data may be a DL control channel for transmitting control information for the fallback operation. The specific P value may be the number of all code blocks constituting a TB. This operation is the same as an operation of transmitting HARQ-ACK for a TB.

TBS Indication in NR

Table 16 below describes LDPC coding.

TABLE 16

The bit sequence input for a given code block to channel coding is denoted by $c_0, c_1, c_2, c_3, \ldots, c_{K-1}$, where K is the number of bits to encode.
After encoding the bits are denoted by $d_0, d_1, d_2, \ldots, d_{N-1}$, where $N = 66Z_c$ for LDPC base graph 1 and $N = (40 + K_b) \cdot Z_c$ for LDPC base graph 2, and the value of $Z_c$ is given below.
For a code block encoded by LDPC, the following encoding procedure applies:
1) For LDPC base graph 1, $K_b = 22$. For LDPC base graph 2, the value of $K_b$ is determined as in section 5.2.1, by setting $B = K - K_F$, where $K_F \geq 0$ is the number of filler bits.
2) Set $Z_c = K/K_b$ and find the set index $i_{LS}$ in Table 5.3.2-1 which contains $Z_c$.
3) for k = $2Z_c$ to K − 1
    if $c_k \neq$ <NULL>
        $d_{k-2Zc} = c_k$;
    else
        $c_k = 0$;
        $d_{k-2Zc}$ = <NULL>;
    end if
  end for
4) Generate $N + 2Z_c - K$ parity bits $w = [w_0, w_1, w_2, \ldots, w_{N+2Z_c-K-1}]^T$ such that $H \times \begin{bmatrix} c \\ w \end{bmatrix} = 0$, where $c = [c_0, c_1, c_2, c_3, \ldots, c_{K-1}]^T$; 0 is a column vector of all elements equal to 0; $H = [H_1\ H_2]$ is a matrix given below. The encoding is performed in GF(2).
The matrix $H_1$ is obtained by replacing each element of $H_{BG}$ with a $Z_c \times Z_c$ matrix, according to the following:
    Each element of value 0 in $H_{BG}$ is replaced by an all zero matrix 0 of size $Z_c \times Z_c$ ;
    Each element of value 1 in $H_{BG}$ is replaced by a circular permutation matrix $I(P_{i,j})$ of size $Z_c \times Z_c$, where i and j are the row and column indices of the element, and $I(P_{i,j})$ is obtained by circularly shifting the identity matrix I of size $Z_c \times Z_c$ to the right $P_{i,j}$ times. The value of $P_{i,j}$ is given by $P_{i,j} = \text{mod}(V_{i,j}, Z_c)$.
The matrix $H_2$ is obtained by replacing each element of $H_{BG,EXT}$ with a $Z_c \times Z_c$ matrix by the following:
    Each element of value 0 in $H_{BG,EXT}$ is replaced by an all zero matrix 0 of size $Z_c \times Z_c$;
    Each element of value 1 in $H_{BG,EXT}$ is replaced by an identity matrix I of size $Z_c \times Z_c$.

TABLE 16-continued

For a code block encoded by LDPC base graph 1,
$H_{BG} = H_{BG1}$, as in Table 5.3.2-2.
The value of $V_{i,j}$ is obtained by one of the Tables 5.3.2-3 to 5.3.2-6 according to the set index $i_{LS}$. In each table of Tables 5.3.2-3 to 5.3.2-6, each row- i contains all values of $V_{i,j}$ corresponding to the non-zero elements in row- i of $H_{BG1}$, from left to right.

$$H_{BG,EXT} = \begin{bmatrix} 0_{5 \times 41} \\ I_{41 \times 41} \end{bmatrix}.$$

For a code block encoded by LDPC base graph 2,
$H_{BG} = \overline{H}_{BG2}$, where $H_{BG2}$ is given in Table 5.3.2-7, and $\overline{H}_{BG2}$ is obtained by removing columns with indices $\{K_b, K_b + 1, \ldots, 9\}$ from $H_{BG2}$ for $K_b \in \{6, 8, 9\}$ and $\overline{H}_{BG2} = H_{BG2}$ for $K_b = 10$;
The value of $V_{i,j}$ is obtained by one of the Tables 5.3.2-8 to 5.3.2-11 according to the set index $i_{LS}$. In each table of Tables 5.3.2-8 to 5.3.2-11, each row- i contains all values of $V_{i,j}$ corresponding to the non-zero elements in row- i of $H_{BG2}$, from left to right.

$$H_{BG,EXT} = \begin{bmatrix} 0_{7 \times 35} \\ I_{35 \times 35} \end{bmatrix}.$$

5) for k = K to N + $2Z_c$ − 1
   $d_{k - 2Z_c} = w_{k - K}$;
   end for

Table 17 shows sets of LDPC lifting sizes Z.

TABLE 17

| Set index ($i_{LS}$) | Set of lifting sizes |
|---|---|
| 1 | {2, 4, 8, 16, 32, 64, 128, 256} |
| 2 | {3, 6, 12, 24, 48, 96, 192, 384} |
| 3 | {5, 10, 20, 40, 80, 160, 320} |
| 4 | {7, 14, 28, 56, 112, 224} |
| 5 | {9, 18, 36, 72, 144, 288} |
| 6 | {11, 22, 44, 88, 176, 352} |
| 7 | {13, 26, 52, 104, 208} |
| 8 | {15, 30, 60, 120, 240} |

Table 18 shows $H_{BG1}$ of LDPC base graph 1.

TABLE 18

| Row Index i | Column index j |||||||||||||||||||||||||||
|---|---|---|---|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 |
| 0 | 1 | 1 | 1 | 1 | 0 | 1 | 1 | 0 | 0 | 1 | 1 | 1 | 1 | 1 | 0 | 1 | 1 | 0 | 1 | 1 | 1 | 1 | 1 | 1 | 0 | 0 | 0 |
| 1 | 1 | 0 | 1 | 1 | 1 | 1 | 0 | 1 | 1 | 1 | 0 | 1 | 1 | 0 | 1 | 1 | 1 | 1 | 0 | 1 | 0 | 1 | 1 | 1 | 1 | 0 | 0 |
| 2 | 1 | 1 | 1 | 0 | 1 | 1 | 1 | 1 | 1 | 1 | 1 | 0 | 0 | 1 | 1 | 1 | 0 | 1 | 1 | 1 | 1 | 0 | 0 | 0 | 1 | 1 | 0 |
| 3 | 1 | 1 | 0 | 1 | 1 | 0 | 1 | 1 | 1 | 0 | 1 | 1 | 1 | 1 | 0 | 1 | 1 | 1 | 0 | 1 | 1 | 1 | 0 | 0 | 1 | 0 | 1 |
| 4 | 1 | 1 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 1 |
| 5 | 1 | 1 | 0 | 1 | 0 | 0 | 0 | 0 | 0 | 0 | 0 | 1 | 0 | 0 | 1 | 0 | 0 | 0 | 0 | 1 | 1 | 0 | 0 | 0 | 0 | 0 | 0 |
| 6 | 1 | 0 | 0 | 0 | 0 | 1 | 0 | 0 | 0 | 1 | 1 | 0 | 1 | 0 | 0 | 1 | 1 | 0 | 1 | 0 | 0 | 0 | 0 | 0 | 0 | 0 | 0 |
| 7 | 1 | 1 | 0 | 0 | 1 | 0 | 0 | 1 | 1 | 0 | 0 | 0 | 0 | 1 | 0 | 0 | 0 | 0 | 0 | 0 | 0 | 0 | 0 | 0 | 0 | 0 | 0 |
| 8 | 1 | 1 | 0 | 1 | 0 | 0 | 0 | 0 | 0 | 0 | 1 | 0 | 0 | 0 | 1 | 0 | 0 | 1 | 0 | 1 | 1 | 0 | 1 | 0 | 0 | 0 | 0 |
| 9 | 1 | 1 | 0 | 0 | 0 | 0 | 0 | 0 | 0 | 1 | 1 | 0 | 1 | 0 | 0 | 0 | 1 | 1 | 0 | 1 | 0 | 0 | 0 | 0 | 0 | 0 | 0 |
| 10 | 0 | 1 | 1 | 0 | 1 | 0 | 0 | 1 | 1 | 0 | 0 | 0 | 0 | 1 | 0 | 0 | 0 | 0 | 0 | 0 | 0 | 0 | 0 | 0 | 0 | 0 | 0 |
| 11 | 1 | 1 | 0 | 0 | 0 | 0 | 0 | 0 | 0 | 0 | 0 | 1 | 0 | 0 | 0 | 1 | 0 | 0 | 0 | 0 | 1 | 1 | 1 | 0 | 0 | 0 | 0 |
| 12 | 1 | 1 | 0 | 0 | 0 | 0 | 0 | 0 | 0 | 1 | 1 | 0 | 1 | 0 | 0 | 0 | 0 | 1 | 0 | 0 | 0 | 0 | 0 | 0 | 0 | 0 | 0 |
| 13 | 1 | 0 | 0 | 1 | 0 | 0 | 0 | 1 | 0 | 0 | 0 | 0 | 0 | 0 | 0 | 0 | 0 | 0 | 1 | 0 | 0 | 1 | 0 | 0 | 0 | 0 | 0 |
| 14 | 1 | 0 | 0 | 0 | 0 | 0 | 0 | 0 | 0 | 0 | 1 | 0 | 0 | 1 | 1 | 1 | 0 | 0 | 0 | 1 | 0 | 0 | 0 | 0 | 0 | 0 | 0 |
| 15 | 1 | 1 | 0 | 0 | 0 | 0 | 0 | 0 | 0 | 1 | 0 | 1 | 0 | 0 | 0 | 0 | 1 | 0 | 0 | 0 | 0 | 0 | 0 | 0 | 0 | 1 | 0 |
| 16 | 0 | 1 | 0 | 1 | 0 | 0 | 0 | 0 | 0 | 0 | 1 | 0 | 0 | 0 | 0 | 0 | 0 | 0 | 0 | 1 | 0 | 1 | 0 | 0 | 0 | 0 | 0 |
| 17 | 1 | 0 | 0 | 0 | 0 | 0 | 0 | 0 | 0 | 0 | 0 | 0 | 1 | 0 | 1 | 1 | 0 | 0 | 0 | 1 | 0 | 0 | 0 | 0 | 0 | 0 | 0 |
| 18 | 0 | 1 | 0 | 0 | 0 | 0 | 0 | 0 | 0 | 0 | 1 | 1 | 0 | 0 | 0 | 1 | 1 | 0 | 0 | 0 | 0 | 0 | 0 | 0 | 0 | 0 | 0 |
| 19 | 1 | 1 | 0 | 0 | 0 | 0 | 1 | 1 | 0 | 1 | 0 | 0 | 0 | 0 | 0 | 0 | 0 | 0 | 0 | 0 | 0 | 0 | 0 | 0 | 0 | 0 | 0 |
| 20 | 1 | 0 | 0 | 1 | 0 | 0 | 0 | 0 | 1 | 0 | 1 | 0 | 0 | 0 | 0 | 0 | 0 | 0 | 0 | 0 | 0 | 0 | 1 | 0 | 0 | 0 | 0 |
| 21 | 0 | 1 | 0 | 0 | 0 | 1 | 0 | 0 | 0 | 0 | 0 | 0 | 0 | 1 | 0 | 0 | 0 | 1 | 1 | 0 | 0 | 0 | 0 | 0 | 0 | 0 | 0 |
| 22 | 1 | 0 | 0 | 0 | 0 | 0 | 0 | 0 | 0 | 0 | 1 | 1 | 0 | 0 | 0 | 1 | 0 | 0 | 0 | 0 | 0 | 0 | 0 | 0 | 0 | 0 | 0 |
| 23 | 0 | 1 | 1 | 0 | 0 | 0 | 0 | 0 | 0 | 1 | 0 | 0 | 0 | 0 | 0 | 0 | 1 | 0 | 0 | 0 | 0 | 0 | 0 | 0 | 0 | 0 | 0 |
| 24 | 1 | 0 | 0 | 1 | 1 | 0 | 0 | 0 | 0 | 0 | 1 | 0 | 0 | 0 | 0 | 0 | 0 | 0 | 0 | 0 | 0 | 1 | 0 | 0 | 0 | 0 | 0 |
| 25 | 0 | 1 | 0 | 0 | 0 | 0 | 1 | 1 | 0 | 0 | 0 | 0 | 0 | 1 | 0 | 0 | 0 | 0 | 0 | 0 | 0 | 0 | 0 | 0 | 0 | 0 | 0 |
| 26 | 1 | 0 | 1 | 0 | 1 | 0 | 0 | 0 | 0 | 0 | 0 | 0 | 0 | 0 | 0 | 1 | 0 | 0 | 0 | 0 | 0 | 0 | 0 | 0 | 0 | 0 | 0 |
| 27 | 0 | 1 | 0 | 0 | 0 | 1 | 0 | 1 | 0 | 0 | 0 | 0 | 0 | 0 | 0 | 0 | 0 | 0 | 0 | 0 | 0 | 0 | 0 | 0 | 0 | 0 | 0 |
| 28 | 1 | 0 | 0 | 0 | 1 | 0 | 0 | 0 | 0 | 0 | 0 | 0 | 0 | 0 | 0 | 0 | 0 | 1 | 0 | 1 | 0 | 0 | 0 | 0 | 0 | 0 | 0 |
| 29 | 0 | 1 | 0 | 0 | 0 | 0 | 0 | 0 | 0 | 0 | 0 | 0 | 1 | 0 | 0 | 1 | 0 | 0 | 0 | 0 | 0 | 0 | 0 | 1 | 0 |
| 30 | 1 | 0 | 0 | 0 | 0 | 0 | 0 | 0 | 1 | 0 | 0 | 1 | 0 | 0 | 0 | 0 | 0 | 0 | 0 | 0 | 0 | 0 | 0 | 1 | 0 | 0 |
| 31 | 0 | 1 | 0 | 0 | 0 | 0 | 0 | 1 | 0 | 0 | 0 | 0 | 0 | 0 | 0 | 0 | 0 | 0 | 0 | 0 | 0 | 1 | 0 | 0 | 1 | 0 |

TABLE 18-continued

| Row Index | Column index j | | | | | | | | | | | | | | | | | | | | | | | | | | |
|---|---|---|---|---|---|---|---|---|---|---|---|---|---|---|---|---|---|---|---|---|---|---|---|---|---|---|---|
| i | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 |
| 32 | 1 | 0 | 0 | 0 | 0 | 0 | 0 | 0 | 0 | 0 | 0 | 0 | 1 | 0 | 1 | 0 | 0 | 0 | 0 | 0 | 0 | 0 | 0 | 1 | 0 | 0 | 0 |
| 33 | 0 | 1 | 1 | 0 | 0 | 0 | 0 | 0 | 0 | 0 | 0 | 1 | 0 | 0 | 0 | 0 | 0 | 0 | 0 | 0 | 1 | 0 | 0 | 0 | 0 | 0 | 0 |
| 34 | 1 | 0 | 0 | 0 | 0 | 0 | 0 | 1 | 0 | 0 | 0 | 0 | 0 | 0 | 0 | 1 | 0 | 1 | 0 | 0 | 0 | 0 | 0 | 0 | 0 | 0 | 0 |
| 35 | 0 | 1 | 0 | 0 | 0 | 0 | 1 | 0 | 0 | 0 | 0 | 0 | 1 | 0 | 0 | 0 | 0 | 0 | 0 | 0 | 0 | 1 | 0 | 0 | 0 | 0 | 0 |
| 36 | 1 | 0 | 0 | 0 | 0 | 0 | 0 | 0 | 0 | 0 | 0 | 0 | 0 | 0 | 1 | 1 | 0 | 0 | 1 | 0 | 0 | 0 | 0 | 0 | 0 | 0 | 0 |
| 37 | 0 | 1 | 0 | 0 | 0 | 0 | 0 | 0 | 0 | 0 | 0 | 0 | 1 | 0 | 0 | 0 | 0 | 0 | 0 | 0 | 0 | 0 | 1 | 0 | 0 | 0 | 0 |
| 38 | 1 | 0 | 0 | 0 | 0 | 0 | 0 | 0 | 1 | 1 | 0 | 1 | 0 | 0 | 0 | 0 | 0 | 0 | 0 | 0 | 0 | 0 | 0 | 0 | 0 | 0 | 0 |
| 39 | 0 | 1 | 0 | 1 | 0 | 0 | 0 | 1 | 0 | 0 | 0 | 0 | 0 | 0 | 0 | 0 | 0 | 0 | 0 | 1 | 0 | 0 | 0 | 0 | 0 | 0 | 0 |
| 40 | 1 | 0 | 0 | 0 | 0 | 0 | 0 | 0 | 1 | 0 | 0 | 0 | 0 | 0 | 0 | 0 | 1 | 0 | 0 | 0 | 0 | 0 | 0 | 0 | 0 | 0 | 0 |
| 41 | 0 | 1 | 0 | 1 | 0 | 0 | 0 | 0 | 0 | 1 | 0 | 0 | 0 | 0 | 0 | 0 | 0 | 1 | 0 | 0 | 0 | 0 | 0 | 0 | 0 | 0 | 0 |
| 42 | 1 | 0 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 1 | 0 | 0 |
| 43 | 0 | 1 | 0 | 0 | 0 | 0 | 0 | 0 | 0 | 0 | 0 | 0 | 0 | 0 | 0 | 1 | 0 | 1 | 0 | 0 | 0 | 0 | 0 | 0 | 0 | 1 | 0 |
| 44 | 1 | 0 | 0 | 0 | 0 | 0 | 0 | 1 | 0 | 1 | 0 | 0 | 0 | 0 | 0 | 0 | 0 | 0 | 0 | 0 | 0 | 0 | 1 | 0 | 0 | 0 | 0 |
| 45 | 0 | 1 | 0 | 0 | 0 | 0 | 1 | 0 | 0 | 0 | 1 | 0 | 0 | 0 | 0 | 0 | 0 | 0 | 0 | 0 | 0 | 0 | 0 | 0 | 0 | 0 | 0 |

Table 19 shows parity check matrices 1 and 2 for $H_{BG1}$, corresponding to $i_{LS}=1$ and $i_{LS}=2$.

TABLE 19

| Row index i | Shift value $V_{i,j}$ ($i_{LS}$ = 1) | Shift value $V_{i,j}$ ($i_{LS}$ = 2) |
|---|---|---|
| 0 | 250, 69, 226, 159, 100, 10, 59, 229, 110, 191, 9, 195, 23, 190, 35, 239, 31, 1, 0 | 307, 19, 50, 369, 181, 216, 317, 288, 109, 17, 357, 215, 106, 242, 180, 330, 346, 1, 0 |
| 1 | 2, 239, 117, 124, 71, 222, 104, 173, 220, 102, 109, 132, 142, 155, 255, 28, 0, 0, 0 | 76, 76, 73, 288, 144, 331, 331, 178, 295, 342, 217, 99, 354, 114, 331, 112, 0, 0, 0 |
| 2 | 106, 111, 185, 63, 117, 93, 229, 177, 95, 39, 142, 225, 225, 245, 205, 251, 117, 0, 0 | 205, 250, 328, 332, 256, 161, 267, 160, 63, 129, 200, 88, 53, 131, 240, 205, 13, 0, 0 |
| 3 | 121, 89, 84, 20, 150, 131, 243, 136, 86, 246, 219, 211, 240, 76, 244, 144, 12, 1, 0 | 276, 87, 0, 275, 199, 153, 56, 132, 305, 231, 341, 212, 304, 300, 271, 39, 357, 1, 0 |
| 4 | 157, 102, 0 | 332, 181, 0 |
| 5 | 205, 236, 194, 231, 28, 123, 115 | 195, 14, 115, 166, 241, 51, 157 |
| 6 | 183, 22, 28, 67, 244, 11, 157, 211 | 278, 257, 1, 351, 92, 253, 18, 225 |
| 7 | 220, 44, 159, 31, 167, 104 | 9, 62, 316, 333, 290, 114 |
| 8 | 112, 4, 7, 211, 102, 164, 109, 241, 90 | 307, 179, 165, 18, 39, 224, 368, 67, 170 |
| 9 | 103, 182, 109, 21, 142, 14, 61, 216 | 366, 232, 321, 133, 57, 303, 63, 82 |
| 10 | 98, 149, 167, 160, 49, 58 | 101, 339, 274, 111, 383, 354 |
| 11 | 77, 41, 83, 182, 78, 252, 22 | 48, 102, 8, 47, 188, 334, 115 |
| 12 | 160, 42, 21, 32, 234, 7 | 77, 186, 174, 232, 50, 74 |
| 13 | 177, 248, 151, 185, 62 | 313, 177, 266, 115, 370 |
| 14 | 206, 55, 206, 127, 16, 229 | 142, 248, 137, 89, 347, 12 |
| 15 | 40, 96, 65, 63, 75, 179 | 241, 2, 210, 318, 55, 269 |
| 16 | 64, 49, 49, 51, 154 | 13, 338, 57, 289, 57 |
| 17 | 7, 164, 59, 1, 144 | 260, 303, 81, 358, 375 |
| 18 | 42, 233, 8, 155, 147 | 130, 163, 280, 132, 4 |
| 19 | 60, 73, 72, 127, 224 | 145, 213, 344, 242, 197 |
| 20 | 151, 186, 217, 47, 160 | 187, 206, 264, 341, 59 |
| 21 | 249, 121, 109, 131, 171 | 205, 102, 328, 213, 97 |
| 22 | 64, 142, 188, 158 | 30, 11, 233, 22 |
| 23 | 156, 147, 170, 152 | 24, 89, 61, 27 |
| 24 | 112, 86, 236, 116, 222 | 298, 158, 235, 339, 234 |
| 25 | 23, 136, 116, 182 | 72, 17, 383, 312 |
| 26 | 195, 243, 215, 61 | 71, 81, 76, 136 |
| 27 | 25, 104, 194 | 194, 194, 101 |
| 28 | 128, 165, 181, 63 | 222, 19, 244, 274 |
| 29 | 86, 236, 84, 6 | 252, 5, 147, 78 |
| 30 | 216, 73, 120, 9 | 159, 229, 260, 90 |
| 31 | 95, 177, 172, 61 | 100, 215, 258, 256 |
| 32 | 221, 112, 199, 121 | 102, 201, 175, 287 |
| 33 | 2, 187, 41, 211 | 323, 8, 361, 105 |
| 34 | 127, 167, 164, 159 | 230, 148, 202, 312 |
| 35 | 161, 197, 207, 103 | 320, 335, 2, 266 |

TABLE 19-continued

| Row index i | Shift value $V_{i,j}$ ($i_{LS}$ = 1) | Shift value $V_{i,j}$ ($i_{LS}$ = 2) |
|---|---|---|
| 36 | 37, 105, 51, 120 | 210, 313, 297, 21 |
| 37 | 198, 220, 122 | 269, 82, 115 |
| 38 | 167, 151, 157, 163 | 185, 177, 289, 214 |
| 39 | 173, 139, 149, 0 | 258, 93, 346, 297 |
| 40 | 157, 137, 149 | 175, 37, 312 |
| 41 | 167, 173, 139, 151 | 52, 314, 139, 288 |
| 42 | 149, 157, 137 | 113, 14, 218 |
| 43 | 151, 163, 173, 139 | 113, 132, 114, 168 |
| 44 | 139, 157, 163, 173 | 80, 78, 163, 274 |
| 45 | 149, 151, 167 | 135, 149, 15 |

Table 20 shows parity check matrices 3 and 4 for $H_{BG1}$, corresponding to $i_{LS}=3$ and $i_{LS}=4$.

TABLE 20

| Row index i | Shift value $V_{i,j}$ ($i_{LS}$ = 3) | Shift value $V_{i,j}$ ($i_{LS}$ = 4) |
|---|---|---|
| 0 | 73, 15, 103, 49, 240, 39, 15, 162, 215, 164, 133, 298, 110, 113, 16, 189, 32, 1, 0 | 223, 16, 94, 91, 74, 10, 0, 205, 216, 21, 215, 14, 70, 141, 198, 104, 81, 1, 0 |
| 1 | 303, 294, 27, 261, 161, 133, 4, 80, 129, 300, 76, 266, 72, 83, 260, 301, 0, 0, 0 | 141, 45, 151, 46, 119, 157, 133, 87, 206, 93, 79, 9, 118, 194, 31, 187, 0, 0, 0 |
| 2 | 68, 7, 80, 280, 38, 227, 202, 200, 71, 106, 295, 283, 301, 184, 246, 230, 276, 0, 0 | 207, 203, 31, 176, 180, 186, 95, 153, 177, 70, 77, 214, 77, 198, 117, 223, 90, 0, 0 |
| 3 | 220, 208, 30, 197, 61, 175, 79, 281, 303, 253, 164, 53, 44, 28, 77, 319, 68, 1, 0 | 201, 18, 165, 5, 45, 142, 16, 34, 155, 213, 147, 69, 96, 74, 99, 30, 158, 1, 0 |
| 4 | 233, 205, 0 | 170, 10, 0 |
| 5 | 83, 292, 50, 318, 201, 267, 279 | 164, 59, 86, 80, 182, 130, 153 |
| 6 | 289, 21, 293, 13, 232, 302, 138, 235 | 158, 119, 113, 21, 63, 51, 136, 116 |
| 7 | 12, 88, 207, 50, 25, 76 | 17, 76, 104, 100, 150, 158 |
| 8 | 295, 133, 130, 231, 296, 110, 269, 245, 154 | 33, 95, 4, 217, 204, 39, 58, 44, 201 |
| 9 | 189, 244, 36, 286, 151, 267, 135, 209 | 9, 37, 213, 105, 89, 185, 109, 218 |
| 10 | 14, 80, 211, 75, 161, 311 | 82, 165, 174, 19, 194, 103 |
| 11 | 16, 147, 290, 289, 177, 43, 280 | 52, 11, 2, 35, 32, 84, 201 |
| 12 | 229, 235, 169, 48, 105, 52 | 142, 175, 136, 3, 28, 182 |
| 13 | 39, 302, 303, 160, 37 | 81, 56, 72, 217, 78 |
| 14 | 78, 299, 54, 61, 179, 258 | 14, 175, 211, 191, 51, 43 |
| 15 | 229, 290, 60, 130, 184, 51 | 90, 120, 131, 209, 209, 81 |
| 16 | 69, 140, 45, 115, 300 | 154, 164, 43, 189, 101 |
| 17 | 257, 147, 128, 51, 228 | 56, 110, 200, 63, 4 |

TABLE 20-continued

| Row index i | Shift value $V_{i,j}$ ($i_{LS}$ = 3) | Shift value $V_{i,j}$ ($i_{LS}$ = 4) |
|---|---|---|
| 18 | 260, 294, 291, 141, 295 | 199, 110, 200, 143, 186 |
| 19 | 64, 181, 101, 270, 41 | 8, 6, 103, 198, 8 |
| 20 | 301, 162, 40, 130, 10 | 105, 210, 121, 214, 183 |
| 21 | 79, 175, 132, 283, 103 | 192, 131, 220, 50, 106 |
| 22 | 177, 20, 55, 316 | 53, 0, 3, 148 |
| 23 | 249, 50, 133, 105 | 88, 203, 168, 122 |
| 24 | 289, 280, 110, 187, 281 | 49, 157, 64, 193, 124 |
| 25 | 172, 295, 96, 46 | 1, 166, 65, 81 |
| 26 | 270, 110, 318, 67 | 107, 176, 212, 127 |
| 27 | 210, 29, 304 | 208, 141, 174 |
| 28 | 11, 293, 50, 234 | 146, 153, 217, 114 |
| 29 | 27, 308, 117, 29 | 150, 11, 53, 68 |
| 30 | 91, 23, 105, 135 | 34, 130, 210, 123 |
| 31 | 222, 308, 66, 162 | 175, 49, 177, 128 |
| 32 | 210, 22, 271, 217 | 192, 209, 58, 30 |
| 33 | 170, 20, 140, 33 | 114, 49, 161, 137 |
| 34 | 187, 296, 5, 44 | 82, 186, 68, 150 |
| 35 | 207, 158, 55, 285 | 192, 173, 26, 187 |
| 36 | 259, 179, 178, 160 | 222, 157, 0, 6 |
| 37 | 298, 15, 115 | 81, 195, 138 |
| 38 | 151, 179, 64, 181 | 123, 90, 73, 10 |
| 39 | 102, 77, 192, 208 | 12, 77, 49, 114 |
| 40 | 32, 80, 197 | 67, 45, 96 |
| 41 | 154, 47, 124, 207 | 23, 215, 60, 167 |
| 42 | 226, 65, 126 | 114, 91, 78 |
| 43 | 228, 69, 176, 102 | 206, 22, 134, 161 |
| 44 | 234, 227, 259, 260 | 84, 4, 9, 12 |
| 45 | 101, 228, 126 | 184, 121, 29 |

Table 21 shows parity check matrices 5 and 6 for $H_{BG1}$, corresponding to $i_{LS}$=5 and $i_{LS}$=6.

TABLE 21

| Row index i | Shift value $V_{i,j}$ ($i_{LS}$ = 5) | Shift value $V_{i,j}$ ($i_{LS}$ = 6) |
|---|---|---|
| 0 | 211, 198, 188, 186, 219, 4, 29, 144, 116, 216, 115, 233, 144, 95, 216, 73, 261, 1, 0 | 294, 118, 167, 330, 207, 165, 243, 250, 1, 339, 201, 53, 347, 304, 167, 47, 188, 1, 0 |
| 1 | 179, 162, 223, 256, 160, 76, 202, 117, 109, 15, 72, 152, 158, 147, 156, 119, 0, 0, 0 | 77, 225, 96, 338, 268, 112, 302, 50, 167, 253, 334, 242, 257, 133, 9, 302, 0, 0, 0 |
| 2 | 258, 167, 220, 133, 243, 202, 218, 63, 0, 3, 74, 229, 0, 216, 269, 200, 234, 0, 0 | 226, 35, 213, 302, 111, 265, 128, 237, 294, 127, 110, 286, 125, 131, 163 210, 7, 0, 0 |
| 3 | 187, 145, 166, 108, 82, 132, 197, 41, 162, 57, 36, 115, 242, 165, 0, 113, 108, 1, 0 | 97, 94, 49, 279, 139, 166, 91, 106, 246, 345, 269, 185, 249, 215, 143, 121, 121, 1, 0 |
| 4 | 246, 235, 0 | 42, 256, 0 |
| 5 | 261, 181, 72, 283, 254, 79, 144 | 219, 130, 251, 322, 295, 258, 283 |
| 6 | 80, 144, 169, 90, 59, 177, 151, 108 | 294, 73, 330, 99, 172, 150, 284, 305 |
| 7 | 169, 189, 154, 184, 104, 164 | 3, 103, 224, 297, 215, 39 |
| 8 | 54, 0, 252, 41, 98, 46, 15, 230, 54 | 348, 75, 22, 312, 224, 17, 59, 314, 244 |
| 9 | 162, 159, 93, 134, 45, 132, 76, 209 | 156, 88, 293, 111, 92, 152, 23, 337 |
| 10 | 178, 1, 28, 267, 234, 201 | 175, 253, 27, 231, 49, 267 |
| 11 | 55.23, 274, 181, 273, 39, 26 | 25.322, 200, 351, 166, 338, 192 |
| 12 | 225.162, 244, 151, 238, 243 | 123, 217, 142, 110, 176, 76 |
| 13 | 231, 0, 216, 47, 36 | 311, 251, 265, 94, 81 |
| 14 | 0, 186, 253, 16, 0, 79 | 22, 322, 277, 156, 66, 78 |
| 15 | 170, 0, 183, 108, 68, 64 | 176, 348, 15, 81, 176, 113 |
| 16 | 270, 13, 99, 54, 0 | 190, 293, 332, 331, 114 |
| 17 | 153, 137, 0, 0, 162 | 110, 228, 247, 116, 190 |
| 18 | 161, 151, 0, 241, 144 | 47, 286, 246, 181, 73 |
| 19 | 0, 0, 118, 144, 0 | 87, 110, 147, 258, 204 |
| 20 | 265, 81, 90, 144, 228 | 89, 65, 155, 244, 30 |
| 21 | 64, 46, 266, 9, 18 | 162, 264, 346, 143, 109 |
| 22 | 72, 189, 72, 257 | 280, 157, 236, 113 |
| 23 | 180, 0, 0, 165 | 18, 6, 181, 304 |

TABLE 21-continued

| Row index i | Shift value $V_{i,j}$ ($i_{LS}$ = 5) | Shift value $V_{i,j}$ ($i_{LS}$ = 6) |
|---|---|---|
| 24 | 236, 199, 0, 266, 0 | 38, 170, 249, 288, 194 |
| 25 | 205, 0, 0, 183 | 279, 255, 111, 54 |
| 26 | 0, 0, 0, 277 | 325, 326, 226, 99 |
| 27 | 45, 36, 72 | 91, 326, 268 |
| 28 | 275, 0, 155, 62 | 102, 1, 40, 167 |
| 29 | 0, 180, 0, 42 | 273, 104, 243, 107 |
| 30 | 0, 90, 252, 173 | 171, 16, 95, 212 |
| 31 | 144, 144, 166, 19 | 101, 297, 279, 222 |
| 32 | 0, 211, 36, 162 | 351, 265, 338, 83 |
| 33 | 0, 0, 76, 18 | 56, 304, 141, 101 |
| 34 | 197, 0, 108, 0 | 60, 320, 112, 54 |
| 35 | 199, 278, 0, 205 | 100, 210, 195, 268 |
| 36 | 216, 16, 0, 0 | 135, 15, 35, 188 |
| 37 | 72, 144, 0 | 319, 236, 85 |
| 38 | 190, 0, 0, 0 | 164, 196, 209, 246 |
| 39 | 153, 0, 165, 117 | 236, 264, 37, 272 |
| 40 | 216, 144, 2 | 304, 237, 135 |
| 41 | 0, 0, 0, 183 | 123, 77, 25, 272 |
| 42 | 27, 0, 35 | 288, 83, 17 |
| 43 | 52, 243, 0.270 | 210, 3, 53, 167 |
| 44 | 18, 0, 0, 57 | 79, 244, 293, 272 |
| 45 | 168, 0, 144 | 82, 67, 235 |

Table 22 shows parity check matrices 7 and 8 for $H_{BG1}$, corresponding to $i_{LS}$=7 and $i_{LS}$=8.

TABLE 22

| Row index i | Shift value $V_{i,j}$ ($i_{LS}$ = 7) | Shift value $V_{i,j}$ ($i_{LS}$ = 8) |
|---|---|---|
| 0 | 0, 0, 0, 0, 0, 0, 0, 0, 0, 0, 0, 0, 0, 0, 0, 0, 0, 0, 0 | 135, 227, 126, 134, 84, 83, 53, 225, 205, 128, 75, 135, 217, 220, 90, 105, 137, 1, 0 |
| 1 | 22, 11, 124, 0, 10, 0, 0, 2, 16, 60, 0, 6, 30, 0, 168, 31, 105, 0, 0 | 96, 236, 136, 221, 128, 92, 172, 56, 11, 189, 95, 85, 153, 87, 163, 216, 0, 0, 0 |
| 2 | 132, 37, 21, 180, 4, 149, 48, 38, 122, 195, 155, 28, 85, 47, 179, 42, 66, 0, 0 | 189, 4, 225, 151, 236, 117, 179, 92, 24, 68, 6, 101, 33, 96, 125, 67, 230, 0, 0 |
| 3 | 4, 6, 33, 113, 49, 21, 6, 151, 83, 154, 87, 5, 92, 173, 120, 2, 142, 0, 0 | 128, 23, 162, 220, 43, 186, 96, 1, 216, 22, 24, 167, 200, 32, 235, 172, 219, 1, 0 |
| 4 | 24, 204, 0 | 64, 211, 0 |
| 5 | 185, 100, 24, 65, 207, 161, 72 | 2, 171, 47, 143, 210, 180, 180 |
| 6 | 6, 27, 163, 50, 48, 24, 38, 91 | 199, 22, 23, 100, 92, 207, 52, 13 |
| 7 | 145, 88, 112, 153, 159, 76 | 77, 146, 209, 32, 166, 18 |
| 8 | 172, 2, 131, 141, 96, 99, 101, 35, 116 | 181, 105, 141, 223, 177, 145, 199, 153, 38 |
| 9 | 6, 10, 145, 53, 201, 4, 164, 173 | 169, 12, 206, 221, 17, 212, 92, 205 |
| 10 | 126, 77, 156, 16, 12, 70 | 116, 151, 70, 230, 115, 84 |
| 11 | 184, 194, 123, 16, 104, 109, 124 | 45, 115, 134, 1, 152, 165, 107 |
| 12 | 6, 20, 203, 153, 104, 207 | 186, 215, 124, 180, 98, 80 |
| 13 | 52, 147, 1, 16, 46 | 220, 185, 154, 178, 150 |
| 14 | 1, 202, 118, 130, 1, 2 | 124, 144, 182, 95, 72, 76 |
| 15 | 173, 6, 81, 182, 53, 46 | 39, 138, 220, 173, 142, 49 |
| 16 | 88, 198, 160, 122, 182 | 78, 152, 84, 5, 205 |
| 17 | 91, 184, 30, 3, 155 | 183, 112, 106, 219, 129 |
| 18 | 1, 41, 167, 68, 148 | 183, 215, 180, 143, 14 |
| 19 | 12, 6, 166, 184, 191 | 179, 108, 159, 138, 196 |
| 20 | 6, 12, 15, 5, 30 | 77, 187, 203, 167, 130 |
| 21 | 6, 86, 96, 42, 199 | 197, 122, 215, 65, 216 |
| 22 | 44, 58, 130, 131 | 25, 47, 126, 178 |
| 23 | 45, 18, 132, 100 | 185, 127, 117, 199 |
| 24 | 9, 125, 191, 28, 6 | 32, 178, 2, 156, 58 |
| 25 | 4, 74, 16, 28 | 27, 141, 11, 181 |
| 26 | 21, 142, 192, 197 | 163, 131, 169, 98 |
| 27 | 98, 140, 22 | 165, 232, 9 |
| 28 | 4, 1, 40, 93 | 32, 43, 200, 205 |

TABLE 22-continued

| Row index i | Shift value $V_{i,j}$ ($i_{LS}$ = 7) | Shift value $V_{i,j}$ ($i_{LS}$ = 8) |
|---|---|---|
| 29 | 92, 136, 106, 6 | 232, 32, 118, 103 |
| 30 | 2, 88, 112, 20 | 170, 199, 26, 105 |
| 31 | 4, 49, 125, 194 | 73, 149, 175, 108 |
| 32 | 6, 126, 63, 20 | 103, 110, 151, 211 |
| 33 | 10, 30, 6, 92 | 199, 132, 172, 65 |
| 34 | 4, 153, 197, 155 | 161, 237, 142, 180 |
| 35 | 4, 45, 168, 185 | 231, 174, 145, 100 |
| 36 | 6, 200, 177, 43 | 11, 207, 42, 100 |
| 37 | 82, 2, 135 | 59, 204, 161 |
| 38 | 91, 64, 198, 100 | 121, 90, 26, 140 |
| 39 | 4, 28, 109, 188 | 115, 188, 168, 52 |
| 40 | 10, 84, 12 | 4, 103, 30 |
| 41 | 2, 75, 142, 128 | 53, 189, 215, 24 |
| 42 | 163, 10, 162 | 222, 170, 71 |
| 43 | 1, 163, 99, 98 | 22, 127, 49, 125 |
| 44 | 4, 6, 142, 3 | 191, 211, 187, 148 |
| 45 | 181, 45, 153 | 177, 114, 93 |

Table 23 shows $H_{BG2}$ of LDPC base graph 2.

TABLE 23

| Row Index i | Column index j | | | | | | | | | | | | | | | | |
|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 |
| 0 | 1 | 1 | 1 | 1 | 0 | 0 | 1 | 0 | 0 | 1 | 1 | 1 | 0 | 0 | 0 | 0 | 0 |
| 1 | 1 | 0 | 0 | 1 | 1 | 1 | 1 | 1 | 1 | 1 | 0 | 1 | 1 | 0 | 0 | 0 | 0 |
| 2 | 1 | 1 | 0 | 1 | 1 | 0 | 0 | 0 | 1 | 0 | 1 | 0 | 1 | 1 | 0 | 0 | 0 |
| 3 | 0 | 1 | 1 | 0 | 1 | 1 | 1 | 1 | 1 | 1 | 1 | 0 | 0 | 1 | 0 | 0 | 0 |
| 4 | 1 | 1 | 0 | 0 | 0 | 0 | 0 | 0 | 0 | 0 | 0 | 1 | 0 | 0 | 1 | 0 | 0 |
| 5 | 1 | 1 | 0 | 0 | 0 | 1 | 0 | 1 | 0 | 0 | 0 | 1 | 0 | 0 | 0 | 1 | 0 |
| 6 | 1 | 0 | 0 | 0 | 0 | 1 | 0 | 1 | 0 | 1 | 0 | 1 | 0 | 0 | 0 | 0 | 1 |
| 7 | 0 | 1 | 0 | 0 | 0 | 1 | 0 | 1 | 0 | 0 | 0 | 1 | 0 | 1 | 0 | 0 | 0 |
| 8 | 1 | 1 | 0 | 0 | 0 | 0 | 0 | 0 | 0 | 0 | 0 | 0 | 1 | 0 | 0 | 0 | 0 |
| 9 | 0 | 1 | 0 | 0 | 0 | 0 | 0 | 0 | 1 | 0 | 1 | 1 | 0 | 0 | 0 | 0 | 0 |
| 10 | 1 | 1 | 0 | 0 | 0 | 0 | 1 | 1 | 0 | 0 | 0 | 0 | 0 | 0 | 0 | 0 | 0 |
| 11 | 1 | 0 | 0 | 0 | 0 | 0 | 0 | 1 | 0 | 1 | 0 | 0 | 1 | 0 | 0 | 0 | 0 |
| 12 | 0 | 1 | 0 | 1 | 0 | 0 | 0 | 0 | 0 | 0 | 0 | 1 | 0 | 0 | 0 | 0 | 0 |
| 13 | 1 | 1 | 0 | 0 | 0 | 0 | 0 | 0 | 1 | 0 | 0 | 0 | 1 | 0 | 0 | 0 | 0 |
| 14 | 0 | 1 | 0 | 0 | 0 | 0 | 1 | 0 | 0 | 0 | 0 | 1 | 0 | 1 | 0 | 0 | 0 |
| 15 | 1 | 0 | 0 | 0 | 0 | 0 | 0 | 0 | 0 | 0 | 1 | 1 | 0 | 0 | 0 | 0 | 0 |
| 16 | 0 | 1 | 0 | 0 | 0 | 0 | 0 | 0 | 0 | 1 | 0 | 1 | 1 | 0 | 0 | 0 | 0 |
| 17 | 0 | 1 | 0 | 0 | 0 | 1 | 0 | 0 | 0 | 0 | 0 | 1 | 1 | 0 | 0 | 0 | 0 |
| 18 | 1 | 0 | 0 | 0 | 0 | 0 | 1 | 1 | 0 | 0 | 0 | 0 | 0 | 0 | 0 | 0 | 0 |
| 19 | 1 | 1 | 0 | 0 | 0 | 0 | 0 | 0 | 0 | 0 | 1 | 0 | 0 | 0 | 0 | 0 | 0 |
| 20 | 0 | 1 | 0 | 0 | 1 | 0 | 0 | 0 | 0 | 0 | 0 | 1 | 0 | 0 | 0 | 0 | 0 |
| 21 | 1 | 0 | 0 | 0 | 0 | 0 | 0 | 0 | 1 | 0 | 0 | 0 | 0 | 1 | 0 | 0 | 0 |
| 22 | 0 | 1 | 1 | 0 | 0 | 0 | 0 | 0 | 0 | 0 | 0 | 0 | 0 | 0 | 0 | 0 | 0 |
| 23 | 1 | 0 | 0 | 1 | 0 | 1 | 0 | 0 | 0 | 0 | 0 | 0 | 0 | 0 | 0 | 0 | 0 |
| 24 | 0 | 1 | 1 | 0 | 0 | 0 | 0 | 0 | 0 | 1 | 0 | 0 | 0 | 0 | 0 | 0 | 0 |
| 25 | 1 | 0 | 0 | 0 | 0 | 1 | 0 | 0 | 0 | 0 | 0 | 0 | 0 | 0 | 0 | 0 | 0 |
| 26 | 0 | 0 | 1 | 0 | 0 | 0 | 0 | 1 | 0 | 0 | 0 | 0 | 1 | 1 | 0 | 0 | 0 |
| 27 | 1 | 0 | 0 | 0 | 0 | 0 | 1 | 0 | 0 | 0 | 0 | 0 | 0 | 0 | 0 | 0 | 0 |
| 28 | 0 | 1 | 1 | 0 | 0 | 1 | 0 | 0 | 0 | 0 | 0 | 0 | 0 | 0 | 0 | 0 | 0 |
| 29 | 1 | 0 | 0 | 0 | 1 | 0 | 0 | 0 | 0 | 0 | 0 | 0 | 0 | 0 | 0 | 0 | 0 |
| 30 | 0 | 0 | 1 | 0 | 0 | 1 | 0 | 1 | 0 | 1 | 0 | 0 | 0 | 0 | 0 | 0 | 0 |
| 31 | 0 | 1 | 0 | 0 | 0 | 0 | 0 | 0 | 0 | 0 | 0 | 0 | 1 | 0 | 0 | 0 | 0 |
| 32 | 1 | 0 | 0 | 0 | 0 | 1 | 0 | 0 | 0 | 0 | 0 | 1 | 0 | 0 | 0 | 0 | 0 |
| 33 | 0 | 0 | 1 | 0 | 0 | 0 | 0 | 1 | 0 | 0 | 0 | 0 | 0 | 0 | 0 | 0 | 0 |
| 34 | 1 | 0 | 0 | 0 | 0 | 0 | 0 | 0 | 0 | 0 | 1 | 1 | 0 | 0 | 0 | 0 | 0 |
| 35 | 0 | 1 | 0 | 0 | 0 | 1 | 0 | 0 | 0 | 0 | 1 | 0 | 0 | 0 | 0 | 0 | 0 |
| 36 | 1 | 0 | 1 | 0 | 0 | 0 | 0 | 1 | 0 | 0 | 0 | 0 | 0 | 0 | 0 | 0 | 0 |
| 37 | 0 | 0 | 0 | 0 | 0 | 0 | 0 | 0 | 0 | 0 | 0 | 0 | 1 | 0 | 0 | 0 | 0 |
| 38 | 0 | 1 | 0 | 0 | 1 | 0 | 0 | 0 | 0 | 0 | 1 | 0 | 0 | 0 | 0 | 0 | 0 |
| 39 | 1 | 0 | 0 | 0 | 0 | 0 | 1 | 0 | 0 | 0 | 0 | 1 | 0 | 0 | 0 | 0 | 0 |
| 40 | 0 | 0 | 1 | 0 | 0 | 0 | 0 | 0 | 0 | 0 | 0 | 0 | 1 | 0 | 0 | 0 | 0 |
| 41 | 0 | 1 | 0 | 0 | 0 | 1 | 0 | 0 | 0 | 0 | 1 | 0 | 0 | 0 | 0 | 0 | 0 |

Table 24 shows parity check matrices 1 and 2 for $H_{BG2}$, corresponding to $i_{LS}=1$ and $i_{LS}=2$.

TABLE 24

| Row index i | Shift value $V_{i,j}$ ($i_{LS}$ = 1) | Shift value $V_{i,j}$ ($i_{LS}$ = 2) |
| --- | --- | --- |
| 0 | 9, 117, 204, 26, 189, 205, 0, 0 | 174, 97, 166, 66, 71, 172, 0, 0 |
| 1 | 167, 166, 253, 125, 226, 156, 224, 252, 0, 0 | 27, 36, 48, 92, 31, 187, 185, 3, 0, 0 |
| 2 | 81, 114, 44, 52, 240, 1, 0, 0 | 25, 114, 117, 110, 114, 1, 0, 0 |
| 3 | 8, 58, 158, 104, 209, 54, 18, 128, 0, 0 | 136, 175, 113, 72, 123, 118, 28, 186, 0, 0 |
| 4 | 179, 214, 71, 0 | 72, 74, 29, 0 |
| 5 | 231, 41, 194, 159, 103, 0 | 10, 44, 121, 80, 48, 0 |
| 6 | 155, 228, 45, 28, 158, 0 | 129, 92, 100, 49, 184, 0 |
| 7 | 129, 147, 140, 3, 116 | 80, 186, 16, 102, 143 |
| 8 | 142, 94, 230 | 118, 70, 152 |
| 9 | 203, 205, 61, 247 | 28, 132, 185, 178 |
| 10 | 11, 185, 0, 117 | 59, 104, 22, 52 |
| 11 | 11, 236, 210, 56 | 32, 92, 174, 154 |
| 12 | 63, 111, 14 | 39, 93, 11 |
| 13 | 83, 2, 38, 222 | 49, 125, 35, 166 |
| 14 | 115, 145, 3, 232 | 19, 118, 21, 163 |
| 15 | 51, 175, 213 | 68, 63, 81 |
| 16 | 203, 142, 8, 242 | 87, 177, 135, 64 |
| 17 | 254, 124, 114, 64 | 158, 23, 9, 6 |
| 18 | 220, 194, 50 | 186, 6, 46 |
| 19 | 87, 20, 185 | 58, 42, 156 |
| 20 | 26, 105, 29 | 76, 61, 153 |
| 21 | 76, 42, 210 | 157, 175, 67 |
| 22 | 222, 63 | 20, 52 |
| 23 | 23, 235, 238 | 106, 86, 95 |
| 24 | 46, 139, 8 | 182, 153, 64 |
| 25 | 228, 156 | 45, 21 |
| 26 | 29, 143, 160, 122 | 67, 137, 55, 85 |
| 27 | 8, 151 | 103, 50 |
| 28 | 98, 101, 135 | 70, 111, 168 |
| 29 | 18, 28 | 110, 17 |
| 30 | 71, 240, 9, 84 | 120, 154, 52, 56 |
| 31 | 106, 1 | 3, 170 |
| 32 | 242, 44, 166 | 84, 8, 17 |
| 33 | 132, 164, 235 | 165, 179, 124 |
| 34 | 147, 85, 36 | 173, 177, 12 |
| 35 | 57, 40, 63 | 77, 184, 18 |
| 36 | 140, 38, 154 | 25, 151, 170 |
| 37 | 219, 151 | 37, 31 |
| 38 | 31, 66, 38 | 84, 151, 190 |
| 39 | 239, 172, 34 | 93, 132, 57 |
| 40 | 0, 75, 120 | 103, 107, 163 |
| 41 | 129, 229, 118 | 147, 7, 60 |

Table 25 shows parity check matrices 3 and 4 for $H_{BG2}$, corresponding to $i_{LS}=3$ and $i_{LS}=4$.

TABLE 25

| Row index i | Shift value $V_{i,j}$ ($i_{LS}$ = 3) | Shift value $V_{i,j}$ ($i_{LS}$ = 4) |
| --- | --- | --- |
| 0 | 0, 0, 0, 0, 0, 0, 0, 0 | 72, 110, 23, 181, 95, 8, 1, 0 |
| 1 | 137, 124, 0, 0, 88, 0, 0, 55, 0, 0 | 53, 156, 115, 156, 115, 200, 29, 31, 0, 0 |
| 2 | 20, 94, 99, 9, 108, 1, 0, 0 | 152, 131, 46, 191, 91, 0, 0, 0 |
| 3 | 38, 15, 102, 146, 12, 57, 53, 46, 0, 0 | 185, 6, 36, 124, 124, 110, 156, 133, 1, 0 |
| 4 | 0, 136, 157, 0 | 200, 16, 101, 0 |
| 5 | 0, 131, 142, 141, 64, 0 | 185, 138, 170, 219, 193, 0 |
| 6 | 0, 124, 99, 45, 148, 0 | 123, 55, 31, 222, 209, 0 |
| 7 | 0, 45, 148, 96, 78 | 103, 13, 105, 150, 181 |
| 8 | 0, 65, 87 | 147, 43, 152 |
| 9 | 0, 97, 51, 85 | 2, 30, 184, 83 |
| 10 | 0, 17, 156, 20 | 174, 150, 8, 56 |
| 11 | 0, 7, 4, 2 | 99, 138, 110, 99 |
| 12 | 0, 113, 48 | 46, 217, 109 |
| 13 | 0, 112, 102, 26 | 37, 113, 143, 140 |
| 14 | 0, 138, 57, 27 | 36, 95, 40, 116 |
| 15 | 0, 73, 99 | 116, 200, 110 |
| 16 | 0, 79, 111, 143 | 75, 158, 134, 97 |
| 17 | 0, 24, 109, 18 | 48, 132, 206, 2 |
| 18 | 0, 18, 86 | 68, 16, 156 |
| 19 | 0, 158, 154 | 35, 138, 86 |
| 20 | 0, 148, 104 | 6, 20, 141 |
| 21 | 0, 17, 33 | 80, 43, 81 |
| 22 | 0, 4 | 49, 1 |
| 23 | 0, 75, 158 | 156, 54, 134 |
| 24 | 0, 69, 87 | 153, 88, 63 |
| 25 | 0, 65 | 211, 94 |
| 26 | 0, 100, 13, 7 | 90, 6, 221, 6 |
| 27 | 0, 32 | 27, 118 |
| 28 | 0, 126, 110 | 216, 212, 193 |
| 29 | 0, 154 | 108, 61 |
| 30 | 0, 35, 51, 134 | 106, 44, 185, 176 |
| 31 | 0, 20 | 147, 182 |
| 32 | 0, 20, 122 | 108, 21, 110 |
| 33 | 0, 88, 13 | 71, 12, 109 |
| 34 | 0, 19, 78 | 29, 201, 69 |
| 35 | 0, 157, 6 | 91, 165, 55 |
| 36 | 0, 63, 82 | 1, 175, 83 |
| 37 | 0, 144 | 40, 12 |
| 38 | 0, 93, 19 | 37, 97, 46 |
| 39 | 0, 24, 138 | 106, 181, 154 |
| 40 | 0, 36, 143 | 98, 35, 36 |
| 41 | 0, 2, 55 | 120, 101, 81 |

Table 26 shows parity check matrices 5 and 6 for $H_{BG2}$, corresponding to $i_{LS}=5$ and $i_{LS}=6$.

TABLE 26

| Row index i | Shift value $V_{i,j}$ ($i_{LS}$ = 5) | Shift value $V_{i,j}$ ($i_{LS}$ = 6) |
| --- | --- | --- |
| 0 | 3, 26, 53, 35, 115, 127, 0, 0 | 156, 143, 14, 3, 40, 123, 0, 0 |
| 1 | 19, 94, 104, 66, 84, 98, 69, 50, 0, 0 | 17, 65, 63, 1, 55, 37, 171, 133, 0, 0 |
| 2 | 95, 106, 92, 110, 111, 1, 0, 0 | 98, 168, 107, 82, 142, 1, 0, 0 |
| 3 | 120, 121, 22, 4, 73, 49, 128, 79, 0, 0 | 53, 174, 174, 127, 17, 89, 17, 105, 0, 0 |
| 4 | 42, 24, 51, 0 | 86, 67, 83, 0 |
| 5 | 40, 140, 84, 137, 71, 0 | 79, 84, 35, 103, 60, 0 |
| 6 | 109, 87, 107, 133, 139, 0 | 47, 154, 10, 155, 29, 0 |
| 7 | 97, 135, 35, 108, 65 | 48, 125, 24, 47, 55 |
| 8 | 70, 69, 88 | 53, 31, 161 |
| 9 | 97, 40, 24, 49 | 104, 142, 99, 64 |
| 10 | 46, 41, 101, 96 | 111, 25, 174, 23 |
| 11 | 28, 30, 116, 64 | 91, 175, 24, 141 |
| 12 | 33, 122, 131 | 122, 11, 4 |
| 13 | 76, 37, 62, 47 | 29, 91, 27, 127 |
| 14 | 143, 51, 130, 97 | 11, 145, 8, 166 |
| 15 | 139, 96, 128 | 137, 103, 40 |
| 16 | 48, 9, 28, 8 | 78, 158, 17, 165 |
| 17 | 120, 43, 65, 42 | 134, 23, 62, 163 |
| 18 | 17, 106, 142 | 173, 31, 22 |
| 19 | 79, 28, 41 | 13, 135, 145 |
| 20 | 2, 103, 78 | 128, 52, 173 |
| 21 | 91, 75, 81 | 156, 166, 40 |
| 22 | 54, 132 | 18, 163 |
| 23 | 68, 115, 56 | 110, 132, 150 |
| 24 | 30, 42, 101 | 113, 108, 61 |
| 25 | 128, 63 | 72, 136 |
| 26 | 142, 28, 100, 133 | 36, 38, 53, 145 |
| 27 | 13, 10 | 42, 104 |

TABLE 26-continued

| Row index i | Shift value $V_{i,j}$ ($i_{LS}$ = 5) | Shift value $V_{i,j}$ ($i_{LS}$ = 6) |
|---|---|---|
| 28 | 106, 77, 43 | 64, 24, 149 |
| 29 | 133, 25 | 139, 161 |
| 30 | 87, 56, 104, 70 | 84, 173, 93, 29 |
| 31 | 80, 139 | 117, 148 |
| 32 | 32, 89, 71 | 116, 73, 142 |
| 33 | 135, 6, 2 | 105, 137, 29 |
| 34 | 37, 25, 114 | 11, 41, 162 |
| 35 | 60, 137, 93 | 126, 152, 172 |
| 36 | 121, 129, 26 | 73, 154, 129 |
| 37 | 97, 56 | 167, 38 |
| 38 | 1, 70, 1 | 112, 7, 19 |
| 39 | 119, 32, 142 | 109, 6, 105 |
| 40 | 6, 73, 102 | 160, 156, 82 |
| 41 | 48, 47, 19 | 132, 6, 8 |

Table 27 shows parity check matrices 7 and 8 for $H_{BG2}$, corresponding to $i_{LS}$=7 and $i_{LS}$=8.

TABLE 27

| Row index i | Shift value $V_{i,j}$ ($i_{LS}$ = 7) | Shift value $V_{i,j}$ ($i_{LS}$ = 8) |
|---|---|---|
| 0 | 143, 19, 176, 165, 196, 13, 0, 0 | 145, 131, 71, 21, 23, 112, 1, 0 |
| 1 | 18, 27, 3, 102, 185, 17, 14, 180, 0, 0 | 142, 174, 183, 27, 96, 23, 9, 167, 0, 0 |
| 2 | 126, 163, 47, 183, 132, 1, 0, 0 | 74, 31, 3, 53, 155, 0, 0, 0 |
| 3 | 36, 48, 18, 111, 203, 3, 191, 160, 0, 0 | 239, 171, 95, 110, 159, 199, 43, 75, 1, 0 |
| 4 | 43, 27, 117, 0 | 29, 140, 180, 0 |
| 5 | 136, 49, 36, 132, 62, 0 | 121, 41, 169, 88, 207, 0 |
| 6 | 7, 34, 198, 168, 12, 0 | 137, 72, 172, 124, 56, 0 |
| 7 | 163, 78, 143, 107, 58 | 86, 186, 87, 172, 154 |
| 8 | 101, 177, 22 | 176, 169, 225 |
| 9 | 186, 27, 205, 81 | 167, 238, 48, 68 |
| 10 | 125, 60, 177, 51 | 38, 217, 208, 232 |
| 11 | 39, 29, 35, 8 | 178, 214, 168, 51 |
| 12 | 18, 155, 49 | 124, 122, 72 |
| 13 | 32, 53, 95, 186 | 48, 57, 167, 219 |
| 14 | 91, 20, 52, 109 | 82, 232, 204, 162 |
| 15 | 174, 108, 102 | 38, 217, 157 |
| 16 | 125, 31, 54, 176 | 170, 23, 175, 202 |
| 17 | 57, 201, 142, 35 | 196, 173, 195, 218 |
| 18 | 129, 203, 140 | 128, 211, 210 |
| 19 | 110, 124, 52 | 39, 84, 88 |
| 20 | 196, 35, 114 | 117, 227, 6 |
| 21 | 10, 122, 23 | 238, 13, 11 |
| 22 | 202, 126 | 195, 44 |
| 23 | 52, 170, 13 | 5, 94, 111 |
| 24 | 113, 161, 88 | 81, 19, 130 |
| 25 | 197, 194 | 66, 95 |
| 26 | 164, 172, 49, 161 | 146, 66, 190, 86 |
| 27 | 168, 193 | 64, 181 |
| 28 | 14, 186, 46 | 7, 144, 16 |
| 29 | 50, 27 | 25, 57 |
| 30 | 70, 17, 50, 6 | 37, 139, 221.17 |
| 31 | 115, 189 | 201, 46 |
| 32 | 110, 0, 163 | 179, 14, 116 |
| 33 | 163, 173, 179 | 46, 2, 106 |
| 34 | 197, 191, 193 | 184, 135, 141 |
| 35 | 157, 167, 181 | 85, 225, 175 |
| 36 | 197, 167, 179 | 178, 112, 106 |
| 37 | 181, 193 | 154, 114 |
| 38 | 157, 173, 191 | 42, 41, 105 |
| 39 | 181, 157, 173 | 167, 45, 189 |
| 40 | 193, 163, 179 | 78, 67, 180 |
| 41 | 191, 197, 167 | 53, 215, 230 |

In the case of NR, the degree of freedom of resource allocation is greatly increased and various use cases need to be supported. A slot that may be allocated for DL transmission has various lengths such as 7 OFDM symbols and 14 OFDM symbols and resources that may allocated to the UE in the slot may also be adjusted in units of one OFDM symbol. In addition, control signaling such as a demodulation reference signal (DM RS), a channel state information-reference signal (CSI-RS), a phase tracking reference signal (PT RS), and a PDCCH may be variably changed. In the legacy LTE standard, a TBS has been designed in the form of tables on the assuming that a specific number of REs is present in one subframe. When the TBS is designed in the same manner as in NR, multiple tables should be designed or the TBS should be calculated using a scaling factor. When scaling is performed using a specific number, a scaled TBS may be an inaccurate value, thereby resulting in system performance degradation. Therefore, a new method for TBS indication is proposed hereinbelow.

The TBS may be determined based on the amount of resources allocated for transmission, modulation, code rate, and the number of spatial layers. Herein, the amount of resources allocated may be determined based on the number $N_{PRB}$ of RBs which are resource allocation units and on the number $N_{REperPRB}$ of REs constituting an RB. In the LTE standard, it is assumed that the number of REs in an RB is 120 and the amount of resources allocated may be calculated according to the number of RBs allocated. The modulation and the code rate may be acquired through MCS signaling. In this case, the code rate may be implicitly or explicitly indicated through MCS signaling. That is, the code rate may be explicitly indicated in an MCS table or may be implicitly represented in a corresponding MCS index. In the LTE standard, the MCS table is tied to a CQI table. Spectral efficiency of the MCS table may be inferred using spectral efficiency of the CQI table and the code rate may be calculated using a relationship with modulation. However, in LTE, there is a case in which an approximating value of the code rate of the CQI table may be obtained due to a restriction on a QPP interleaver size. In multi-layer transmission, a TBS may be increased in proportion to the number $N_{layer}$ of layers. In NR, since the amount of resources is variously changed, it is desirable to directly calculate the TBS using a function relationship of Equation 7 below instead of using a table look-up method.

$$TBS_{temp} = f(N_{PRB}, N_{REperPBR}, MCS, N_{layer}) \quad \text{[Table 7]}$$

The TBS may be selected from a TBS set which closely approximates $TBS_{temp}$ according to a supported granularity of the TBS. That is, the TBS is as indicated by Equation 8 below.

$$TBS = TBS_j, \text{ if } \min_j(\text{abs}(TBS_j - TBS_{temp})) \quad \text{[Equation 8]}$$

Here, $$\min_j(a_j)$$

denotes a function of calculating an index j corresponding to a minimum value of $a_j$ and abs(a) denotes a function of calculating an absolute value of a.

A method of transmitting and acquiring information of $N_{REperPRB}$ is proposed under the assumption that $N_{PRB}$, MCS, and $N_{layer}$ are information that may be obtained through a DL control channel.

$N_{REperPRB}$ may be semi-statically configured. To change $N_{REperPRB}$, a time is needed. Accordingly, it is desirable to configure and use $N_{REperPRB}$ used for a fallback mode that transmitting/receiving sides assume to be commonly used. For example, a DCI format used for the fallback mode may configure and use a default value of $N_{REperPRB}$.

$N_{REperPRB}$ may be configured according to a slot format (or a group of slot formats) or a slot configuration (or a group of slot configurations). For example, $N_{REperPRB}$ may be configured as X REs for slot format A and as Y REs for slot format B. Here, X and Y may be different.

$N_{REperPRB}$ may be configured per usage scenario (or provided service type). That is, $N_{REperPRB}$ may be configured and used according to eMBB, URLLC, or mMTC. A plurality of values of $N_{REperPRB}$ may be configured per usage scenario. The number of values of $N_{REperPRB}$ configured per usage may differ. The configured value of $N_{REperPRB}$ may be semi-statically changed. A gNB may transmit information about a plurality of configured values of $N_{REperPRB}$ to the UE through the DL control channel. For example, assuming that 4 values of $N_{REperPRB}$ are configured for an eMBB service, the gNB may inform the UE of which $N_{REperPRB}$ among the 4 values of $N_{REperPRB}$ should be used to calculate the TBS through the DL control channel. Then, the gNB may transmit the information about a plurality of configured values of $N_{REperPRB}$ (e.g., 4 values of $N_{REperPRB}$) to the UE through MAC or RRC signaling.

For the DL control channel indicating retransmission, $N_{REperPRB}$ that has been used for TBS calculation in initial transmission may be assumed. When the gNB signals $N_{REperPRB}$ through the DL control channel, the UE may use a corresponding field indicating $N_{REperPRB}$ during retransmission for other purposes or interpret the field as being reserved or being unavailable.

$N_{REperPRB}$ may be (differently) configured according to SC-FDMA or OFDMA. This considers that DM RS overhead varies with SC-FDMA or OFDMA.

When the transmitting side (e.g., gNB) retransmits eMBB data by multiplexing the eMBB data with URLLC data, it may be assumed that $N_{REperPRB}$ for the eMBB data is different from $N_{REperPRB}$ for the URLLC data. During retransmission, $N_{REperPRB}$ for the eMBB data may be designated as $N_{REperPRB}$ having a mapping relationship to $N_{REperPRB}$ configured during initial transmission. Alternatively, during retransmission, $N_{REperPRB}$ for the eMBB data may be designated as a fixed value. During retransmission, the gNB may select $N_{REperPRB}$ for the eMBB data from among a plurality of preset values of $N_{REperPRB}$ and transmit the selected value of $N_{REperPRB}$ to the UE through the DL control channel.

$N_{REperPRB}$ for DL data and $N_{REperPRB}$ for UL data may be configured as different numbers and different values. This considers that numerology and overhead of DL and UL may be differently assumed.

For a PDSCH for transmitting information for common control (e.g., an SIB, paging, and a random access response), the TBS may be desirably calculated by assuming a specific value of $N_{REperPRB}$. The specific value of $N_{REperPRB}$ may differ according to a slot format or a slot configuration.

The transmitting side may transmit $N_{REperPRB}$ using joint signaling with all or a part of $N_{PRB}$, MCS, and $N_{layer}$. In this case, $N_{REperPRB}$ may be differently configured according to an allocated degree of $N_{PRB}$. In addition, $N_{REperPRB}$ may be differently configured according to MCS information. $N_{REperPRB}$ may also be different configured according to $N_{layer}$.

The above-described embodiments correspond to combinations of elements and features of the present disclosure in prescribed forms. And, the respective elements or features may be considered as selective unless they are explicitly mentioned. Each of the elements or features can be implemented in a form failing to be combined with other elements or features. Moreover, it is able to implement an embodiment of the present disclosure by combining elements and/or features together in part. A sequence of operations explained for each embodiment of the present disclosure can be modified. Some configurations or features of one embodiment can be included in another embodiment or can be substituted for corresponding configurations or features of another embodiment. And, it is apparently understandable that an embodiment is configured by combining claims failing to have relation of explicit citation in the appended claims together or can be included as new claims by amendment after filing an application.

Those skilled in the art will appreciate that the present disclosure may be carried out in other specific ways than those set forth herein without departing from the essential characteristics of the present disclosure. The above embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

The invention claimed is:

1. A method of performing rate matching for a low-density parity check (LDPC) code by a user equipment (UE), the method comprising:
   receiving indication information on whether limited buffer rate matching (LBRM) is applied;
   determining a transport block size (TBS) based on the indication information; and
   performing rate matching for the LDPC code based on the TBS,
   wherein the indication information includes information on a maximum number of TBSs configured for the LBRM, and
   wherein, based on the LBRM being configured for the UE, the TBS is determined as the maximum value among the maximum number of TBSs.

2. The method of claim 1, wherein the rate matching is related to limited buffer rate matching (LBRM), the method further comprising: receiving information about the LBRM configured for the UE from a base station (BS).

3. The method of claim 2, wherein the TBS is determined based on the number of resource elements (REs) allocated to one physical resource block (PRB).

4. The method of claim 3, wherein the number of REs allocated to the one PRB is determined based on reference signal (RS) overhead.

5. The method of claim 3, wherein the number of REs allocated to the one PRB is differently configured according to a provided service type.

6. The method of claim 3, further comprising:
   receiving information about the number of REs allocated to the one PRB from the BS.

7. The method of claim 2, wherein the TBS differs according to the size of coded bits defined by the LBRM.

8. The method of claim 1, wherein, the TBS is determined based on only a specific code rate among a plurality of code rates is used.

9. A user equipment (UE) for performing rate matching for a low-density parity check (LDPC) code, the UE comprising
a transceiver; and one or more processors connected to the transceiver,
wherein the one or more processors are configured to:
receive indication information on whether limited buffer rate matching (LBRM) is applied;
determine a transport block size (TBS) based on the indication information; and
perform rate matching for the LDPC code based on the determined TBS,
wherein the indication information includes information on a maximum number of TBSs configured for the LBRM, and
wherein, based on the LBRM being configured for the UE, the TBS is determined as the maximum value among the maximum number of TBSs.

10. The UE of claim 9, wherein the rate matching is related to limited buffer rate matching (LBRM), the method further comprising: a receiver configured to receive information about the LBRM configured for the UE from a base station (BS).

11. The UE of claim 10, wherein the TBS is determined by the processor based on the number of resource elements (REs) allocated to one physical resource block (PRB).

12. The UE of claim 11, wherein the processor is configured to determine the number of REs allocated to the one PRB based on reference signal (RS) overhead in the one PRB.

13. The UE of claim 11, wherein the number of REs allocated to the one PRB is differently configured according to a provided service type.

14. The UE of claim 11, further comprising a receiver configured to receive information about the number of REs allocated to the one PRB from the BS.

15. The UE of claim 10, wherein the TBS differs according to the number of coded bits defined by the LBRM.

16. The UE of claim 9, wherein the processor is further configured to determine the TBS based on only a specific code rate among a plurality of code rates is used.

17. The UE according to claim 9, wherein the UE is capable of communicating with at least one of another UE, a UE related to an autonomous driving vehicle, a base station or a network.

* * * * *